United States Patent
Watano et al.

(10) Patent No.: US 11,549,054 B2
(45) Date of Patent: *Jan. 10, 2023

(54) PHOSPHOR-CONTAINING FILM AND BACKLIGHT UNIT

(71) Applicant: FUJIFILM Corporation, Tokyo (JP)

(72) Inventors: Akiko Watano, Kanagawa (JP);
Tatsuya Oba, Kanagawa (JP);
Hirofumi Toyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 542 days.

This patent is subject to a terminal disclaimer.

(21) Appl. No.: 16/590,897

(22) Filed: Oct. 2, 2019

(65) Prior Publication Data

US 2020/0032137 A1     Jan. 30, 2020

Related U.S. Application Data

(63) Continuation of application No. PCT/JP2018/013699, filed on Mar. 30, 2018.

(30) Foreign Application Priority Data

Apr. 4, 2017   (JP) .............................. JP2017-074616

(51) Int. Cl.
*C09K 11/02* (2006.01)
*C09K 11/08* (2006.01)
(Continued)

(52) U.S. Cl.
CPC ................ *C09K 11/02* (2013.01); *B23B 3/30* (2013.01); *B32B 27/18* (2013.01); *B32B 27/30* (2013.01);
(Continued)

(58) Field of Classification Search
CPC ........... C09K 11/02; C09K 11/08; B32B 3/30; B32B 2255/10; B32B 2307/7244; H01L 33/502; G02B 6/005
See application file for complete search history.

(56) References Cited

U.S. PATENT DOCUMENTS 10,781,369 B2 *   9/2020   Yonemoto ................ C08J 7/048
10,948,767 B2 *   3/2021   Oba ....................... G02F 1/1336
(Continued)

FOREIGN PATENT DOCUMENTS

CN       102576795 A      7/2012
CN       102738368 A     10/2012
(Continued)

OTHER PUBLICATIONS

Machine translation of KR20100129030A, 4 pages. (Year: 2010).*
(Continued)

*Primary Examiner* — Matthew E. Hoban
*Assistant Examiner* — Lynne Edmondson
(74) *Attorney, Agent, or Firm* — Edwards Neils LLC; Jean C. Edwards, Esq.

(57)     ABSTRACT

Provided is an organic electroluminescent display device that further suppresses reflection of external light when viewed in an oblique direction; a phase difference film; and a circularly polarizing plate. This display device has an organic electroluminescent display panel, and a circularly polarizing plate arranged on the display panel, in which the circularly polarizing plate has a polarizer and a phase difference film, the phase difference film has, from a side of the polarizer, a negative A-plate, and a positive A-plate, the in-plane retardation of the negative A-plate at a wavelength of 550 nm is more than 50 nm and less than 90 nm, and the in-plane retardation of the positive A-plate at a wavelength of 550 nm is 100 to 200 nm, and the angle formed by the (Continued)

in-plane slow axis of the negative A-plate and the in-plane slow axis of the positive A-plate is 45°±10°.

8 Claims, 9 Drawing Sheets

(51) Int. Cl.

| | | |
|---|---|---|
| *B32B 3/30* | (2006.01) | |
| *F21V 8/00* | (2006.01) | |
| *B32B 27/30* | (2006.01) | |
| *B32B 27/36* | (2006.01) | |
| *C09K 11/62* | (2006.01) | |
| *B23B 3/30* | (2006.01) | |
| *B32B 27/18* | (2006.01) | |
| *H01L 33/50* | (2010.01) | |
| *H01L 51/52* | (2006.01) | |

(52) U.S. Cl.
CPC ............ *B32B 27/302* (2013.01); *B32B 27/36* (2013.01); *C09K 11/0811* (2013.01); *C09K 11/0883* (2013.01); *C09K 11/62* (2013.01); *G02B 6/005* (2013.01); *B32B 2255/10* (2013.01); *B32B 2264/305* (2020.08); *B32B 2307/10* (2013.01); *B32B 2307/7244* (2013.01); *G02B 6/0055* (2013.01); *H01L 33/502* (2013.01); *H01L 51/5237* (2013.01)

(56) References Cited

U.S. PATENT DOCUMENTS

| | | | |
|---|---|---|---|
| 10,982,135 B2 * | 4/2021 | Oba | G02B 5/20 |
| 2010/0051898 A1 | 3/2010 | Kim et al. | |
| 2011/0037926 A1 | 2/2011 | Tsukahara et al. | |
| 2012/0200687 A1 | 8/2012 | Kikuchi | |
| 2012/0261700 A1 | 10/2012 | Ooyabu et al. | |
| 2014/0168576 A1 * | 6/2014 | Lee | G02F 1/133603 349/71 |
| 2014/0246689 A1 | 9/2014 | Luo et al. | |
| 2015/0048403 A1 | 2/2015 | Dan et al. | |
| 2015/0308658 A1 | 10/2015 | Shin et al. | |
| 2016/0091640 A1 | 3/2016 | Wu et al. | |
| 2016/0201858 A1 | 7/2016 | Kang et al. | |
| 2018/0072949 A1 | 3/2018 | Satake et al. | |
| 2018/0138027 A1 | 5/2018 | Oku et al. | |
| 2019/0292453 A1 | 9/2019 | Yonemoto | |

FOREIGN PATENT DOCUMENTS

| | | |
|---|---|---|
| CN | 103474559 A | 12/2013 |
| CN | 104037307 A | 9/2014 |
| JP | 11-194484 A | 7/1999 |
| JP | 2009-283441 A | 12/2009 |
| JP | 2010-061098 A | 3/2010 |
| JP | 2016-529552 A | 9/2016 |
| KR | 10-2010-0129030 A | 12/2010 |
| KR | 10-2014-0030404 A | 3/2014 |
| KR | 10-2017-0003318 A | 1/2017 |
| WO | 2014/024218 A1 | 2/2014 |
| WO | 2016/194351 A1 | 12/2016 |
| WO | 2017/026118 A1 | 2/2017 |
| WO | 2018/101348 A1 | 6/2018 |

OTHER PUBLICATIONS

Machine translation of CN103474559A, 6 pages (Year: 2013).*
Office Action, issued by the Japanese Patent Office dated Apr. 28, 2020, in connection with corresponding Japanese Patent Application No. 2019-511203.
International Search Report issued in PCT/JP2018/013699 dated Jun. 26, 2018.
Written Opinion issued in PCT/JP2018/013699 dated Jun. 26, 2018.
International Preliminary Report on Patentability completed by WIPO on Jun. 25, 2019 in connection with International Patent Application No. PCT/JP2018/013699.
Office Action, issued by the Korean Intellectual Property Office dated Oct. 21, 2020, in connection with corresponding Korean Patent Application No. 10-2019-7029022.
Office Action, issued by the State Intellectual Property Office dated Feb. 2, 2021, in connection with Chinese Patent Application No. 201880023695.1.

* cited by examiner

PHOSPHOR-CONTAINING FILM AND BACKLIGHT UNIT

CROSS-REFERENCE TO RELATED APPLICATIONS

This application is a Continuation of PCT International Application No. PCT/JP2018/013699 filed on Mar. 30, 2018, which was published under PCT Article 21(2) in Japanese, and which claims priority under 35 U.S.C. § 119(a) to Japanese Patent Application No. 2017-074616 filed on Apr. 4, 2017. The above applications are hereby expressly incorporated by reference, in their entirety, into the present application.

BACKGROUND OF THE INVENTION

1. Field of the Invention

The present invention relates to a phosphor-containing film containing phosphors that emit fluorescence upon irradiation with excitation light and a backlight unit comprising the phosphor-containing film as a wavelength converting member.

2. Description of the Related Art

Applications of a flat panel display such as a liquid crystal display (LCD) device as a space-saving image display device with low power consumption have been widespread year by year. In recent LCDs, further power saving, an enhancement in color reproducibility, or the like is required as an improvement in LCD performance.

Along with power saving of LCD backlight, in order to increase the light utilization efficiency and improve the color reproducibility, it has been proposed to use a wavelength converting layer containing a quantum dot (QD) that converts a wavelength of an incidence ray and emits the wavelength-converted light, as a luminescent material (phosphor). The quantum dot is also referred to as a quantum point.

The quantum dot has a state of an electron whose movement direction is restricted in all directions three-dimensionally. In a case where nanoparticles of a semiconductor are three-dimensionally surrounded by a high potential barrier, the nanoparticles become quantum dots. The quantum dot expresses various quantum effects. As the quantum effect, for example, a "quantum size effect" is expressed in which a density of electronic states (energy level) is discretized. According to this quantum size effect, the absorption wavelength and luminescence wavelength of light can be controlled by changing the size of a quantum dot.

Generally, such quantum dots are dispersed in a resin or the like, and used as a quantum dot film for wavelength conversion, for example, by being arranged between a backlight and a liquid crystal panel.

In a case where excitation light is incident from a backlight to a film containing quantum dots, the quantum dots are excited to emit fluorescence. Here, white light can be realized by using quantum dots having different luminescence properties and causing each quantum dot to emit light having a narrow half-width of red light, green light, or blue light. Since the fluorescence by the quantum dot has a narrow half-width, wavelengths can be properly selected to thereby allow the resulting white light to be designed so that the white light is high in luminance and excellent in color reproducibility.

Meanwhile, there are problems that quantum dots are susceptible to deterioration due to moisture or oxygen, and particularly the luminescence intensity thereof decreases due to a photooxidation reaction. Therefore, the wavelength converting member is configured in such a manner that barrier films (gas barrier films) are laminated on both main surfaces of a resin layer containing quantum dots, which is a wavelength converting layer, thereby protecting the quantum dot layer. In the following description, the resin layer containing quantum dots is also referred to as a "quantum dot layer".

The barrier film has, for example, a configuration in which a barrier layer exhibiting gas barrier properties is formed on one surface of a support film such as a resin film.

However, merely protecting both main surfaces of the quantum dot layer with barrier films has a problem in which moisture and/or oxygen enters from the end face not protected by the barrier film, and therefore the quantum dots deteriorate.

Therefore, it has been proposed to protect the entire periphery (the entire periphery of the end face) of the quantum dot layer with a barrier film.

For example, JP2010-061098A discloses a quantum point wavelength converting structure including a wavelength converting portion containing quantum points for wavelength-converting excitation light to generate wavelength-converted light and a dispersion medium for dispersing the quantum points, and a sealing member for sealing the wavelength converting portion, in which the wavelength converting portion is arranged between two sealing sheets which are sealing members, and the peripheries of the wavelength converting portion in the sealing sheets are heated and thermally adhered to each other, thereby sealing the wavelength converting portion.

Further, JP2009-283441A discloses a light emitting device comprising a color conversion layer (phosphor layer) for converting at least a part of color light emitted from a light source portion into another color light and a water impermeable sealing sheet for sealing the color conversion layer, and discloses a color conversion sheet (phosphor sheet) in which penetration of water into the color conversion layer is prevented by a configuration where the sheet has a second bonding layer provided in a frame shape along the outer periphery of the phosphor layer, that is, so as to surround the planar shape of the color conversion layer, and the second bonding layer is formed of an adhesive material having water vapor barrier properties.

Meanwhile, the wavelength converting layer containing quantum dots used for LCDs is a thin film of about 50 to 350 μm in thickness. There are problems that it is extremely difficult to coat the entire end face of such a very thin film with a sealing sheet such as a barrier film, thereby leading to poor productivity.

Such problems occur not only in quantum dots, but also in a phosphor-containing film comprising a phosphor which reacts with oxygen and deteriorates.

In addition, in order to produce a phosphor-containing film containing a phosphor such as a quantum dot with high production efficiency, preferred is a method of sequentially carrying out a coating step and a curing step on a long film by a roll-to-roll method to form a laminated structure and then cutting the resulting structure to a desired size.

However, in a case of obtaining a phosphor-containing film of a desired size by cutting from this long film, the phosphor-containing layer is again exposed to the outside air at the cut end face, so it is necessary to take measures against penetration of oxygen from the cut end face.

On the other hand, JP2016-529552A discloses a phosphor-containing film (optical member) including a phosphor-containing layer having a sealing material that forms a plurality of separated regions and a fluorescent material (optical material) containing a phosphor (luminescent material) such as a quantum dot, which is arranged in the regions separated by the sealing material, and two substrate films, in which the base (first base) in which the phosphor-containing layer is formed on one substrate film is sealed with the other substrate film (second base).

According to this phosphor-containing film, the sealed state of the fluorescent material can be maintained even in a case where the phosphor-containing film is cut, by cutting at the sealing material portion.

SUMMARY OF THE INVENTION

However, as described in JP2016-529552A, a phosphor-containing film having a configuration in which a phosphor-containing layer in which a fluorescent material containing a phosphor is divided into a plurality of regions is sandwiched (sealed) by two substrate films has a problem in that the adhesion between the phosphor-containing layer and the substrate film is insufficient on the surface of the opening side of the separated region into which the phosphor is filled.

In a case where the adhesion between the phosphor-containing layer and the substrate film is insufficient, for example, there is a problem that the phosphor-containing layer and the substrate film, which have low mechanical strength, are peeled off from each other, and oxygen penetrates from the peeled portion to deteriorate the phosphor.

The present invention has been made in view of the above circumstances, and an object of the present invention is to provide a phosphor-containing film having a configuration in which a phosphor-containing layer in which a fluorescent material containing a phosphor is divided into a plurality of regions is sealed by two substrate films and exhibiting high adhesion between the phosphor-containing layer and the substrate film.

As a result of extensive studies to achieve the foregoing object, the present inventors have found that, in a phosphor-containing film having a configuration in which a phosphor-containing layer in which a fluorescent material containing a phosphor is divided into a plurality of regions is sealed by two substrate films, the adhesion between the phosphor-containing layer and the substrate film can be improved by providing a gap between the wall portion for dividing the fluorescent material into a plurality of regions and the substrate film, and also making the fluorescent material exist in this gap. The present invention has been completed based on these findings.

That is, the present inventors have found that the foregoing object can be achieved by the following configuration.

[1] A phosphor-containing film comprising:
a phosphor-containing layer having a resin layer in which a plurality of discretely arranged concave portions are formed, and a fluorescent material to be filled in the concave portions formed in the resin layer; and
a first substrate film laminated on a main surface on a bottom side of the concave portions of the resin layer, and a second substrate film laminated on the other main surface of the resin layer,
in which the fluorescent material contains a phosphor and a binder,
at least a part of a wall portion forming the concave portions of the resin layer has a second substrate film-side end spaced apart from the second substrate film, and the fluorescent material is also present between the second substrate film and the second substrate film-side end of the wall portion spaced apart from the second substrate film.

[2] The phosphor-containing film according to [1], in which a distance between the second substrate film and the second substrate film-side end of the wall portion spaced apart from the second substrate film is 0.01 to 10 µm.

[3] The phosphor-containing film according to [1] or [2], in which the resin layer has impermeability to oxygen.

[4] The phosphor-containing film according to any one of [1] to [3], in which at least one of the fluorescent material or the resin layer contains a light scattering particle.

[5] The phosphor-containing film according to any one of [1] to [4], in which all of ends on the second substrate film side of the wall portion of the resin layer are spaced apart from the second substrate film.

[6] The phosphor-containing film according to any one of [1] to [5], in which the fluorescent material present between the second substrate film and the second substrate film-side end of the wall portion spaced apart from the second substrate film contains a material having impermeability to oxygen, in addition to the phosphor and the binder.

[7] The phosphor-containing film according to [6], further comprising: between the second substrate film and the second substrate film-side end of the wall portion spaced apart from the second substrate film
a layer including the fluorescent material containing the material having impermeability to oxygen, in addition to the phosphor and the binder, and
a layer including the material having impermeability to oxygen and located closer to the second substrate film than the layer including the fluorescent material.

[8] The phosphor-containing film according to [6] or [7], in which the material having impermeability to oxygen has the same components as a material for forming the resin layer and does not contain an inorganic layered compound.

[9] A backlight unit comprising:
a wavelength converting member made of the phosphor-containing film according to any one of [1] to [8]; and
at least one of a blue light emitting diode or an ultraviolet light emitting diode.

According to the present invention, it is possible to provide a phosphor-containing film having a configuration in which a phosphor-containing layer in which a fluorescent material containing a phosphor such as quantum dot is divided into a plurality of regions is sealed by two substrate films and exhibiting high adhesion between the phosphor-containing layer and the substrate film; and a long-life backlight unit using the phosphor-containing film.

DESCRIPTION OF THE PREFERRED EMBODIMENTS

Figure 1:
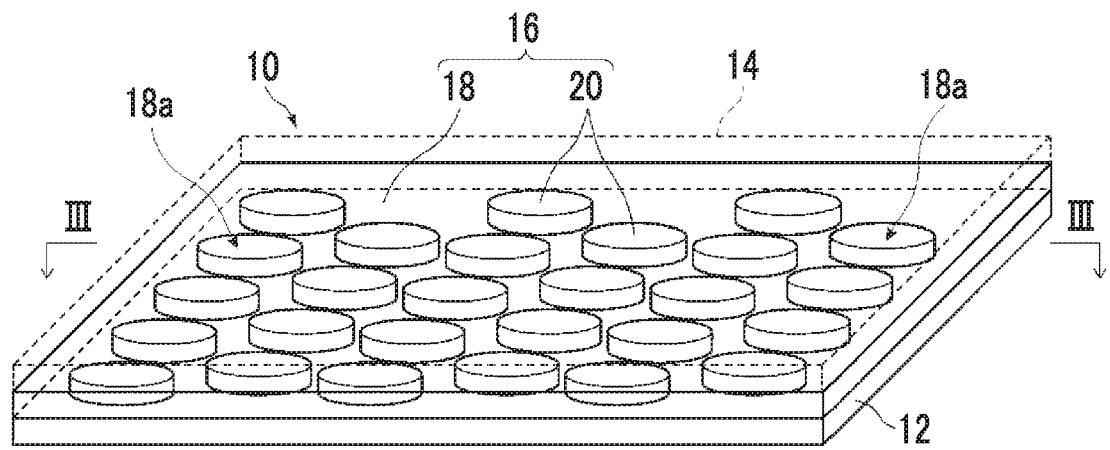
FIG. 1 is a perspective view conceptually showing an example of a phosphor-containing film of the present invention.

Hereinafter, a phosphor-containing film according to the embodiment of the present invention and a backlight unit according to the embodiment of the present invention using the phosphor-containing film according to the embodiment of the present invention will be described in detail based on the suitable embodiments shown in the attached drawings.

In the drawings of the present specification, the scale of each part is appropriately changed in order to clearly show the configuration of the present invention.

In addition, in the present specification, the numerical range expressed by using "to" means a range including numerical values described before and after "to" as a lower limit value and an upper limit value, respectively.

In addition, in the present specification, the term "(meth)acrylate" refers to at least one or any one of acrylate or methacrylate. The same applies to "(meth)acryloyl" and the like.

Phosphor-Containing Film

Figure 2:
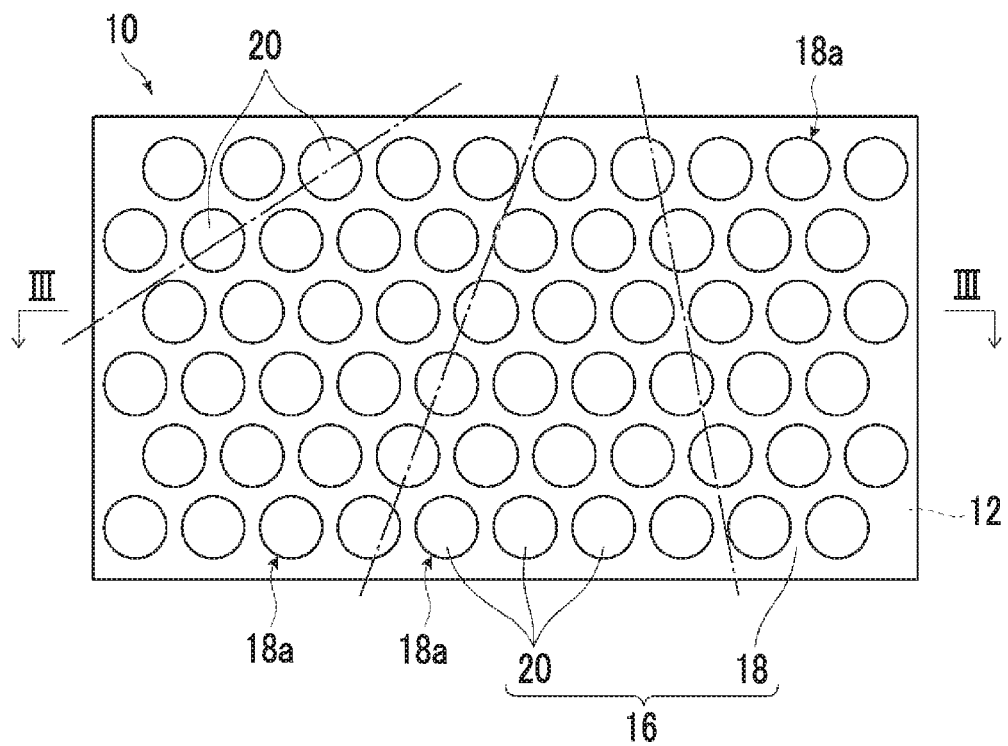
FIG. 2 is a plan view of the phosphor-containing film of FIG. 1.
Figure 3:
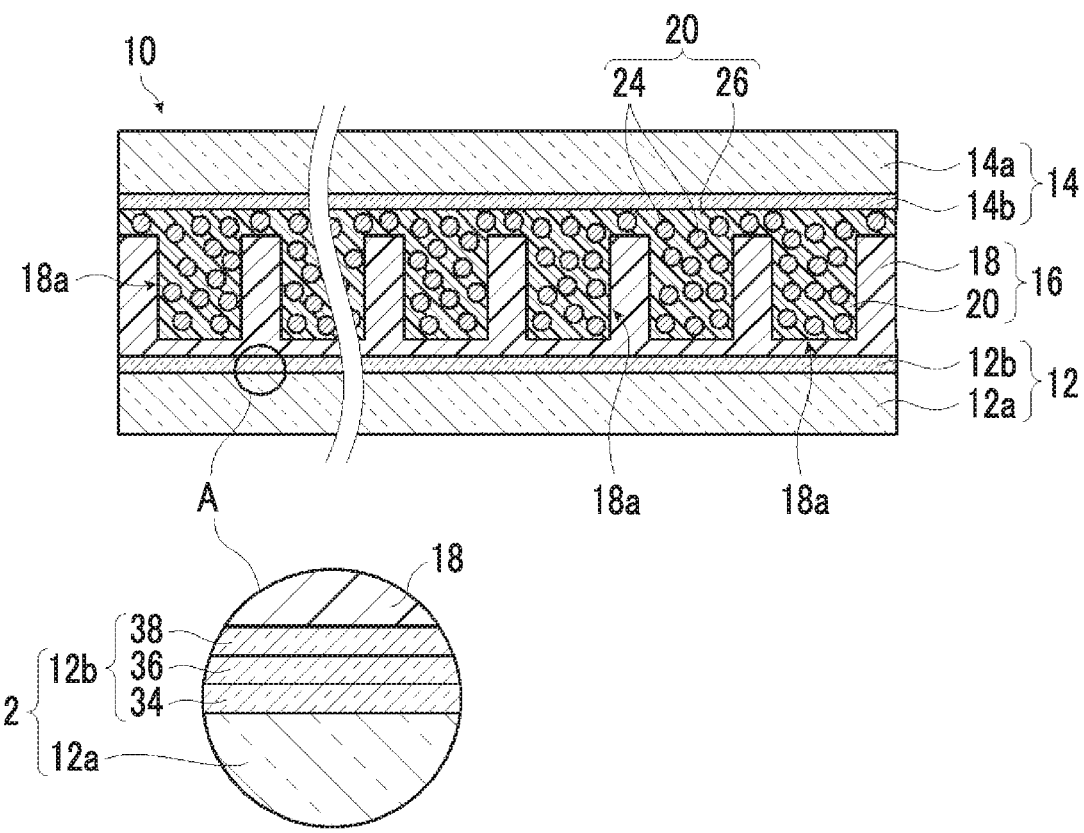
FIG. 3 is a cross-sectional view taken along a line III-III of FIGS. 1 and 2.

FIG. 1 is a perspective view of an example of the phosphor-containing film according to the embodiment of the present invention, FIG. 2 is a plan view of the phosphor-containing film shown in FIG. 1, and FIG. 3 is a cross-sectional view taken along a line III-III of FIGS. 1 and 2. In addition, FIGS. 1 to 3 are views conceptually showing the phosphor-containing film according to the embodiment of the present invention. In addition, the plan view is a view of the phosphor-containing film according to the embodiment of the present invention as viewed from the direction orthogonal to the main surface (maximum surface). In the present specification, unless otherwise noted, the plan view is a view of the phosphor-containing film according to the embodiment of the present invention as viewed from the second substrate film side.

As shown in FIGS. 1 to 3, a phosphor-containing film 10 according to the embodiment of the present invention has a first substrate film 12, a second substrate film 14, and a phosphor-containing layer 16. In addition, in order to clearly show the configuration of the phosphor-containing film 10, the second substrate film 14 is shown by a broken line in FIG. 1, and the second substrate film 14 is omitted in FIG. 2.

As shown in FIG. 3, the first substrate film 12 has a support film 12a and a barrier layer 12b as an example. On the other hand, the second substrate film 14 similarly has a support film 14a and a barrier layer 14b.

In addition, as shown in FIG. 3, the phosphor-containing layer 16 has a resin layer 18 (see FIG. 4) having concave portions 18a discretely formed in the surface direction (main surface direction) of the phosphor-containing film 10; and a fluorescent material 20 filled in the concave portion 18a of the resin layer 18. Furthermore, the fluorescent material 20 has a phosphor 24 and a binder 26.

That is, the phosphor-containing layers 16 are provided with a plurality of the fluorescent materials 20 being spaced apart in the surface direction and containing the phosphors 24. The fluorescent material 20 can also be referred to as a region containing the phosphor 24. That is, in the phosphor-containing layer 16, that is, the phosphor-containing film 10, the fluorescent materials which are the regions containing the phosphors 24 are provided discretely in the surface direction, being spaced apart from one another in the surface direction by the wall portions forming the concave portion 18a of the resin layer 18.

In the present specification, the phrase ". . . are discretely formed" means, more specifically, that, as shown in FIGS. 1 and 2, in a case of being viewed from the direction perpendicular to the main surface of the first substrate film 12 (in plan view), a plurality of fluorescent materials 20 are arranged in isolation without contacting one another in the surface direction of the first substrate film 12. In addition, the surface direction of a film is a two-dimensional direction along a film surface (main surface of a film) in other words.

In the example shown in FIG. 1, the fluorescent materials 20 have a cylindrical shape, and are surrounded by the resin layer 18 in the surface direction of the first substrate film 12, and the resin layer 18 makes it difficult for oxygen to penetrate into the individual fluorescent materials 20 from the surface direction of the first substrate film 12.

With respect to the resin layer 18, preferably at least a wall portion forming the concave portion 18a and more preferably all regions of the resin layer 18 have impermeability to oxygen. Thereby, the phosphor-containing film 10 according to the embodiment of the present invention can prevent deterioration of the phosphor 24 of the fluorescent material 20 more suitably. Further, this effect is particularly noticeable in a case where the binder 26 of the fluorescent material 20 is apt to be permeable to oxygen.

In the present specification, the phrase, "having impermeability to oxygen" means that an oxygen permeability is 10 cc/m$^2$·day·atm or less. The oxygen permeability of the resin layer 18 having impermeability to oxygen is preferably 1 cc/m$^2$·day·atm or less and more preferably $1\times10^{-1}$ cc/m$^2$·day·atm or less.

The SI unit of oxygen permeability is [fm/(s·Pa)]. "fm" is "femtometer" and "1 fm=$1\times10^{-15}$ m". [cc/(m$^2$·day·atm)] can be converted to SI unit by "1 fm/s·Pa=8.752 cc/m$^2$·day·atm".

In the present invention, the oxygen permeability is a value measured using an oxygen gas permeability measuring apparatus (OX-TRAM 2/20, manufactured by MOCON Inc.) under conditions of a measurement temperature of 23° C. and a relative humidity of 90%.

The phrase "having impermeability" and the phrase "having barrier properties" in the present specification are used synonymously. That is, in the present specification, gas barrier properties mean having impermeability to a gas, and a water vapor barrier means having impermeability to water vapor. Further, a layer having impermeability to both of oxygen and water vapor is referred to as a "barrier layer".

In the phosphor-containing film 10 according to the embodiment of the present invention, the fluorescent materials 20 are discretely arranged in the two-dimensional direction. Therefore, assuming that the phosphor-containing film 10 is a part of a long film, whichever portion is linearly cut as indicated by a dashed dotted line in FIG. 2, the fluorescent material 20 other than the fluorescent material 20 which has become the cut point is surrounded by the resin layer 18, and thus the phosphor-containing film 10 can be kept in a sealed state in the surface direction.

In addition, the fluorescent material 20 that has been cut and exposed to outside air loses its original function as a region containing the phosphor 24. However, since the fluorescent material 20 at the cut position, that is, the fluorescent material 20 at the end in the surface direction is usually covered with a member such as a frame constituting a display device (display) or the like, the function as the region containing phosphors is not required, so there is no problem in the performance. In addition, the deactivated fluorescent material becomes a resin layer that protects the fluorescent material 20 not exposed to outside air from the outside air.

In the phosphor-containing film 10 according to the embodiment of the present invention, the first substrate film 12 is laminated on the main surface on a bottom side of the concave portion 18a of the resin layer 18 of the phosphor-containing layer 16. That is, the first substrate film 12 is laminated on the main surface on the closed surface (closed end) side of the concave portion 18a of the resin layer 18. In the illustrated example, the first substrate film 12 is laminated with the barrier layer 12b facing the resin layer 18 side.

On the other hand, the second substrate film 14 is laminated on the main surface of the resin layer 18 constituting the phosphor-containing layer 16 opposite to the first substrate film 12. That is, the second substrate film 14 is laminated on the main surface on the open surface (open end) side of the concave portion 18a of the resin layer 18. In the illustrated example, the second substrate film 14 is laminated with the barrier layer 14b facing the resin layer 18 side.

In the phosphor-containing film according to the embodiment of the present invention, depending on the method of forming the resin layer, there is also a case in which the resin layer has through-holes instead of the concave portion, and the substrate film is used as the bottom to fill the through-holes with the fluorescent material 20.

In this case, it may be configured such that, of the two substrate films sandwiching the resin layer, that is, the phosphor-containing layer, one substrate film is regarded as a first substrate film, and the other is regarded as a second substrate film; the through-hole is regarded as the concave portion of the resin layer; the first substrate film is regarded as the bottom of the concave portion of the resin layer; and on the side of the substrate film regarded as the second substrate film, the end of the wall portion of the resin layer 18 is spaced apart from the second substrate film as described later.

Here, in the phosphor-containing film 10 according to the embodiment of the present invention, as shown in FIG. 3, the wall portion of the resin layer 18 that forms the concave portion 18a has an end on the second substrate film 14 side that is spaced apart from the second substrate film 14. In addition, in the phosphor-containing film 10, the fluorescent material 20 is also present between the second substrate film 14 and the end on the second substrate film 14 side of the wall portion of the resin layer 18 spaced apart from the second substrate film 14.

In the following description, the second substrate film 14 side of the phosphor-containing film 10, that is, the opening side of the concave portion 18a of the resin layer 18 is also referred to as "upper", and the first substrate film 12 side, that is, the bottom side of the concave portion 18a of the resin layer 18 is also referred to as "lower".

Specifically, the wall portion forming the concave portion 18a of the resin layer 18 refers to a portion between the concave portion 18a and the concave portion 18a of the resin layer 18 in the surface direction of the substrate film and a portion forming the outer periphery of the resin layer 18 in the surface direction. That is, the wall portion forming the concave portion 18a of the resin layer 18 means, in other words, the region between the fluorescent material 20 and the fluorescent material 20 in the surface direction of the phosphor-containing layer 16 and the resin layer 18 in the region outside the outermost fluorescent material 20 in the surface direction.

Further, in the example shown in FIGS. 1 to 3, the fluorescent material 20 (the fluorescent material 20 in the concave portion 18a) has a cylindrical shape, and therefore, the wall portion forming the concave portion 18a of the resin layer 18 has a rectangular cross-sectional shape. However, the present invention is not limited to this, and various shapes can be used for the cross-sectional shape of the wall portion.

Figure 4:
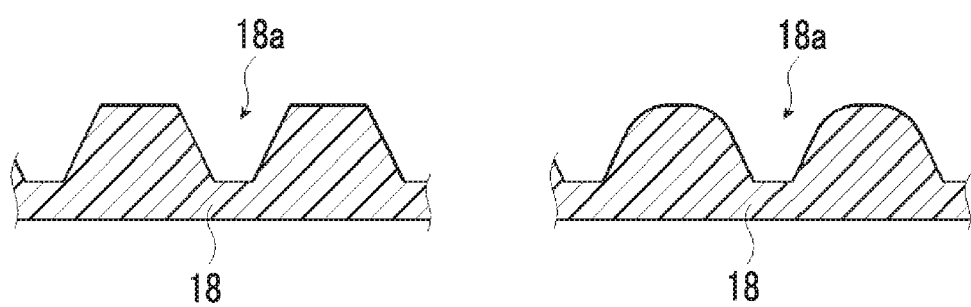
FIG. 4 is a cross-sectional view for explaining an example of a shape of a resin layer of the phosphor-containing film of the present invention.

For example, the wall portion forming the concave portion 18a of the resin layer 18 may have a trapezoidal cross-sectional shape as conceptually shown on the left side of FIG. 4 or may have a cross-sectional shape such that the corner portion on the upper bottom side of the trapezoid is chamfered into a curved surface as conceptually shown on the right side of FIG. 4.

The cross-sectional shape of the wall portion of the resin layer 18 is preferably such that it gradually spreads at least partially, preferably from the upper end to the lower end, downwardly from the upper end as shown in FIG. 4. Here, the phrase "downwardly from the upper end" means, that is, from the end on the second substrate film 14 side to the first substrate film 12 side. Above all, as shown on the right side of FIG. 4, it is preferable to chamfer the corner portion of the upper surface on the second substrate film side. This is advantageous in terms of the ease of formation of the mold forming the resin layer 18, the ease of removal of the mold in a case of forming the resin layer 18, and the prevention of damage to the resin layer 18 to be formed.

As described above, in the phosphor-containing film 10 according to the embodiment of the present invention, the upper end of the wall portion forming the concave portion 18a of the resin layer 18 is spaced apart from the second substrate film 14. The fluorescent material 20 is not only filled in the concave portion 18a of the resin layer 18, but is also provided between the second substrate film 14 and the upper end of the wall portion spaced apart from the second substrate film 14.

In the phosphor-containing film 10 of the illustrated example, as a preferred aspect, as shown in FIG. 3, the wall portions are all spaced apart at the upper end from the second substrate film 14, and the fluorescent material 20 is provided between the wall portion and the second substrate film 14.

According to such a configuration, the present invention achieves the phosphor-containing film 10 having satisfactory adhesion between the phosphor-containing layer 16 (QD film) containing the phosphor 24 and the upper side, that is, the second substrate film on the opening side of the concave portion 18*a* of the resin layer 18.

As mentioned above, phosphors such as quantum dots are deteriorated by oxygen. Therefore, a phosphor-containing film is known in which a layer containing quantum dots (quantum dot layer) is sandwiched by barrier films having oxygen barrier properties.

Here, in order to produce such a phosphor-containing film with high production efficiency, preferred is a method of sequentially carrying out a coating step and a curing step on a long film by a roll-to-roll process to form a laminated structure in which the quantum dot layer is sandwiched by barrier films, and then cutting the resulting structure to a desired size. In a case of obtaining a phosphor-containing film of a desired size by cutting from this long film, the phosphor-containing layer is exposed to the outside air at the cut end face, so it is necessary to take measures against penetration of oxygen from the cut end face.

On the other hand, JP2016-529552A discloses a phosphor-containing film having a configuration such that a sealing material (resin layer) in which housing portions (concave portions) for housing a fluorescent material containing a phosphor such as quantum dot are discretely formed is used to fill the fluorescent material in the housing portions of the sealing material, followed by sandwiching by two barrier films (substrate films). According to this phosphor-containing film, the sealed state of the fluorescent material can be maintained even in a case where an optical component is cut, by cutting a film at the resin layer portion in a case of cutting a long phosphor-containing film produced by a roll-to-roll process.

Although described later, in production of a phosphor-containing film, as an example, a mold having concavities and convexities corresponding to the concave portions and wall portions of the resin layer is filled with a coating liquid to be a resin layer (coating liquid for forming a resin layer), a first substrate film is laminated so as to cover the coating liquid filled in the mold, the coating liquid to be a resin layer is cured, and the mold is removed to form a laminate of the first substrate film and the resin layer.

Next, the concave portions of the resin layer are filled with a coating liquid to be a fluorescent material (coating liquid for forming a fluorescent material), a second substrate film is laminated on the resin layer so that the coating liquid filled in the resin layer is sealed, and the coating liquid to be a fluorescent material is cured, thereby producing a phosphor-containing film in which the phosphor-containing layer having the resin layer and the fluorescent material is sandwiched between the first substrate film and the second substrate film.

The first substrate film and the resin layer are laminated with sufficient adhesion therebetween because the resin layer is laminated in the state of a coating liquid and then the coating liquid is cured. In addition, the resin layer and the fluorescent material are also laminated with sufficient adhesion therebetween because the fluorescent material is filled in the state of a coating liquid and then the coating liquid is cured.

Here, the fluorescent material is filled in the state of a coating liquid and cured in the region corresponding to the concave portion of the resin layer which is filled with the coating liquid to be a fluorescent material, so the phosphor-containing layer and the second substrate film have satisfactory adhesion therebetween. However, in the region corresponding to the upper end of the wall portion of the resin layer in the phosphor-containing layer, the coating liquid to be a fluorescent material is cured in a state where the cured resin layer (upper end of the wall portion) and the second substrate film are in contact with each other. Therefore, there is almost no adhesion between the phosphor-containing layer and the second substrate film.

As a result, the phosphor-containing film in which the phosphor-containing layer having the fluorescent materials discretely is sandwiched by the substrate films suffers from a problem where, on the opening side of the concave portion of the resin layer constituting the phosphor-containing layer (opposite to the bottom side of the concave portion), the adhesion between the phosphor-containing layer and the second substrate film is insufficient, and the mechanical strength therebetween is low, so that the phosphor-containing layer and the second substrate film are peeled off from each other and oxygen penetrates from the peeled portion, thus resulting in deterioration of the phosphor.

On the other hand, in the phosphor-containing film 10 according to the embodiment of the present invention, in the resin layer 18 forming the phosphor-containing layer 16, at least a part of the wall portion constituting the concave portion 18*a* is spaced apart at the upper end from the second substrate film 14; and the fluorescent material 20 is present not only in the concave portion 18*a* but also between the second substrate film 14 and the upper end of the wall portion spaced apart from the second substrate film 14.

As described above, the adhesion between the fluorescent material 20 and the resin layer 18 and the adhesion between the fluorescent material 20 and the second substrate film 14 are sufficient. Therefore, according to the present invention, the long-life phosphor-containing film 10 is obtained in which the adhesion between the phosphor-containing layer 16 and the second substrate film 14 is enhanced, the mechanical strength therebetween is high, and the deterioration of the phosphor 24 due to oxygen caused by the peeling between the phosphor-containing layer 16 and the second substrate film 14 is also prevented.

In the present invention, the space between the second substrate film 14 and the upper end of the wall portion spaced apart from the second substrate film 14 includes not only the region immediately above the wall portion whose upper end is spaced apart from the second substrate film 14, but also the region between the second substrate film 14 and the concave portion 18*a* (the upper end portion thereof) which is adjacent in the surface direction to the wall portion whose upper end is spaced apart from the second substrate film 14.

In the phosphor-containing film 10 according to the embodiment of the present invention, there is no limitation to the configuration in which the wall portions of the resin layer 18 spaced apart from the second substrate film 14 are all spaced apart at the upper end from the second substrate film 14 as shown in FIG. 3, and the fluorescent material 20 is provided therebetween.

However, the adhesion between the phosphor-containing layer 16 and the second substrate film 14 increases as the number of wall portions of the resin layer 18 spaced apart from the second substrate film 14 increases. Taking this point into consideration, in the phosphor-containing film 10, it is preferable that the upper end of the wall portion of the portion corresponding to an area of 30% or more of the area of the display part of the display device where the phosphor-containing film 10 is used is spaced apart from the second substrate film 14, and it is particularly preferable that the wall portions are all spaced apart at the upper end from the second substrate film 14, and the fluorescent material 20 is in contact with the second substrate film 14 on the entire surface.

Figure 5:
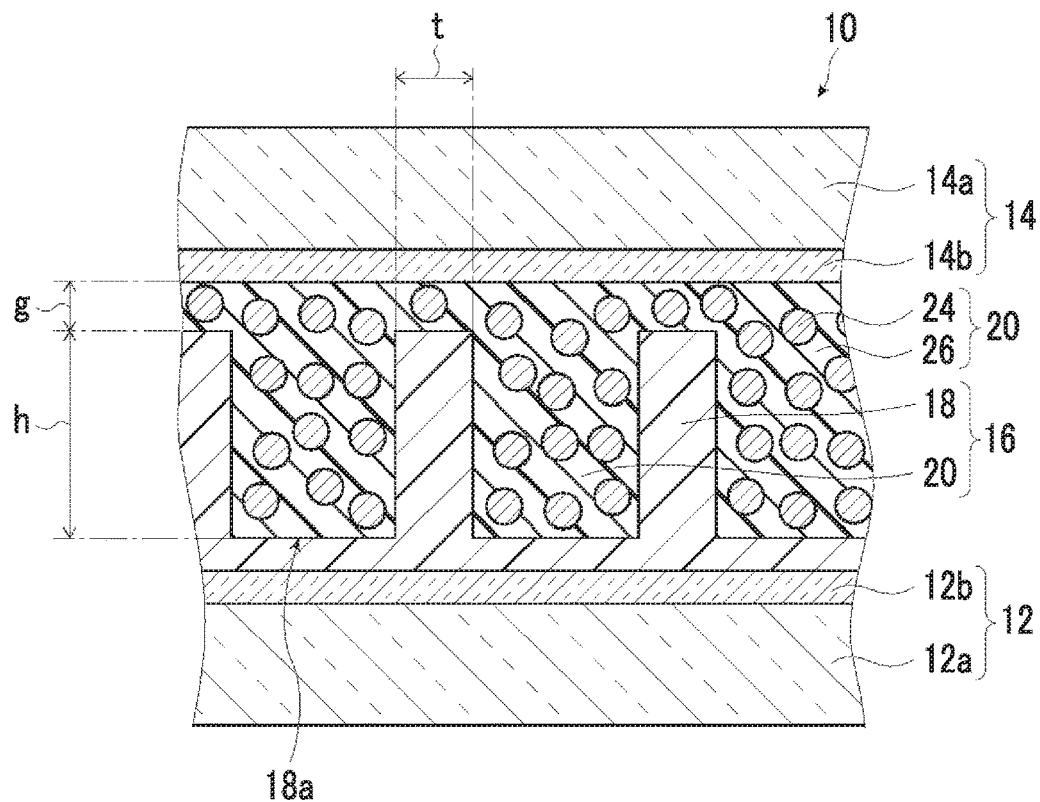
FIG. 5 is a partial enlarged view of FIG. 3.

In the phosphor-containing film 10 according to the embodiment of the present invention, in the wall portion whose upper end is spaced apart from the second substrate film, there is no particular limitation on the gap g (the shortest distance) between the upper end (uppermost portion) of the wall portion and the second substrate film 14, and it is sufficient if both are spaced apart from each other (see FIG. 5).

Here, the gap g between the upper end of the wall portion and the second substrate film 14 is preferably 0.01 to 10 μm, more preferably 0.05 to 4 μm, and still more preferably 0.1 to 4 μm.

By setting the gap g between the upper end of the wall portion and the second substrate film 14 to 0.01 μm or more, the effect of the fluorescent material 20 existing between the upper end of the wall portion and the second substrate film 14 can be sufficiently achieved, and the adhesion between the phosphor-containing layer 16 and the second substrate film 14 can be sufficiently enhanced. In particular, by setting the gap g to 3 μm or more, the adhesion between the phosphor-containing layer 16 and the second substrate film 14 can be made extremely high.

Further, since the fluorescent material 20 is permeable to oxygen more than the resin layer 18, in a case where the gap g between the upper end of the wall portion and the second substrate film 14 is too large, oxygen may permeate through the gap between the upper end of the wall portion and the second substrate film 14 to deteriorate the phosphor 24. On the other hand, by setting the gap g between the upper end of the wall portion and the second substrate film 14 to 10 μm or less, oxygen permeating through the gap between the upper end of the wall portion and the second substrate film 14 can be sufficiently suppressed and the deterioration of the phosphor 24 due to oxygen can be suitably prevented. On the other hand, in a case where a mixed layer 28 or an impermeable layer 30 described later is provided between the upper end of the wall portion and the second substrate film 14, it is possible to suitably prevent the decrease in the light emission luminance due to the thickness of the mixed layer 28 or the impermeable layer 30 being too thick, by setting the gap g between the upper end of the wall portion and the second substrate film 14 to 10 μm or less.

The gap g between the upper end of the wall portion and the second substrate film 14 may be determined by, for example, cutting a part of the wall portion of the phosphor-containing film 10 with a microtome to form a cross section, and observing the section by SEM or the like. In addition, the "portion of the wall portion of the phosphor-containing film 10" is a "portion which is not the concave portion 18a of the phosphor-containing film 10".

In a case where ten gaps g are extracted and an average value is determined, this average value can be regarded as the gap g in the whole of the phosphor-containing film 10.

In the phosphor-containing film 10 according to the embodiment of the present invention, the depth h of the concave portion 18a of the resin layer 18 and the spacing t between the adjacent fluorescent materials 20 (the fluorescent materials 20 in the adjacent concave portions 18a) are not particularly limited.

The depth h of the concave portion of the resin layer 18 is preferably such a depth that the thickness of the fluorescent material 20 from the bottom of the concave portion 18a to the second substrate film 14 (that is, "depth h+gap g") can be 1 to 100 μm. The spacing t between the adjacent fluorescent materials 20 is preferably 5 to 300 μm.

Although the target chromaticity can be reached in a case where the height (film thickness) of the fluorescent material 20 is approximately 1 μm or more, it is preferable to have a film thickness of a certain level or more since the influence of the film thickness unevenness becomes large. On the other hand, in a case where the film thickness of the fluorescent material 20 is too large, the amount of light absorption increases and therefore the initial luminance may decrease. From these viewpoints, the thickness of the fluorescent material 20 from the bottom of the concave portion 18a to the second substrate film 14 is preferably 1 to 100 μm, more preferably 5 to 80 μm, and still more preferably 10 to 50 μm.

The depth h of the concave portion 18a formed in the resin layer 18 and the thickness of the fluorescent material 20 from the bottom of the concave portion 18a to the second substrate film 14 may be determined in such a manner that a portion of the concave portion 18a of the phosphor-containing film is cut with a microtome to form a cross section; the phosphor-containing layer 16 is irradiated with excitation light to cause the phosphor to emit light; and in this state, this cross section is observed with a confocal laser microscope to determine the depth h of the concave portion 18a. In a case where ten concave portions are extracted and an average value is determined, this average value can be regarded as the depth h of the concave portions 18a in the whole of the phosphor-containing film 10.

In addition, it is preferable that the spacing t between the adjacent fluorescent materials 20, that is, the thickness of the wall portion of the resin layer 18 between the adjacent fluorescent materials 20 (between the adjacent concave portions 18a) is made short (thin wall portion) to prevent the resin layer 18 from being visually recognized. On the other hand, from the viewpoint of strength and durability, the spacing t between the adjacent fluorescent materials 20 needs to have a certain width or more. From these viewpoints, the spacing t between the adjacent fluorescent materials 20 is preferably 5 to 300 μm, more preferably 10 to 200 μm, and still more preferably 15 to 100 μm.

The spacing t between the adjacent fluorescent materials 20 is the shortest distance between the adjacent fluorescent materials 20. This spacing t may be determined in such a manner that the phosphor-containing layer 16 is irradiated with excitation light to cause the phosphor to emit light; and in this state, the surface is observed from one surface of the phosphor-containing film 10 using a confocal laser microscope to measure the thickness of the wall portion of the resin layer 18 between the adjacent fluorescent materials 20. In a case where at least 20 portions of the adjacent fluorescent materials 20 are extracted and an average value is determined, this average value can be regarded as the spacing t between the adjacent fluorescent materials 20 in the whole of the phosphor-containing film 10.

In addition, the size and arrangement pattern of the fluorescent materials 20 are not particularly limited and may be appropriately designed according to desired conditions. In designing, geometric constraints for arranging the fluorescent materials 20 spaced apart from one another in plan view, allowable values of the width of the non-light emitting region generated at the time of cutting, and the like are taken into consideration. Further, for example, in a case where the printing method is used as one of the methods of forming the fluorescent material 20 to be described later, there is also a restriction that printing cannot be carried out unless the individual occupied area is not less than a certain size. In addition, the occupied area in this case is an occupied area in plan view.

Furthermore, the shortest distance between the adjacent fluorescent materials 20, that is, the thickness of the wall portion, needs to be a distance that satisfies the durability required for the phosphor-containing film 10. Therefore, the desired shape, size, and arrangement pattern of the fluorescent material 20 may be designed in consideration of these factors.

The ratio of the volume Vp of the fluorescent material 20 to the volume Vb of the resin layer 18 can be a certain ratio, but the ratio of the volume Vp of the fluorescent material 20 to the volume (Vp+Vb) of the entire phosphor-containing layer 16 is preferably $0.1 \leq Vp/(Vp+Vb) < 0.9$, more preferably $0.2 \leq Vp/(Vp+Vb) < 0.85$, and still more preferably $0.3 \leq Vp/(Vp+Vb) < 0.8$.

Note that the volume Vp of the fluorescent material 20 and the volume Vb of the resin layer 18 are defined as the product of the area and the thickness in a case of being observed from the direction orthogonal to the main surface of the phosphor-containing film 10.

In the phosphor-containing film according to the embodiment of the present invention, the fluorescent material 20 between the upper end of the wall portion forming the concave portion 18a and the second substrate film 14 and between the concave portion 18a (upper end portion thereof) and the second substrate film 14 may contain a material having impermeability to oxygen, in addition to the fluorescent material 20.

Figure 6:
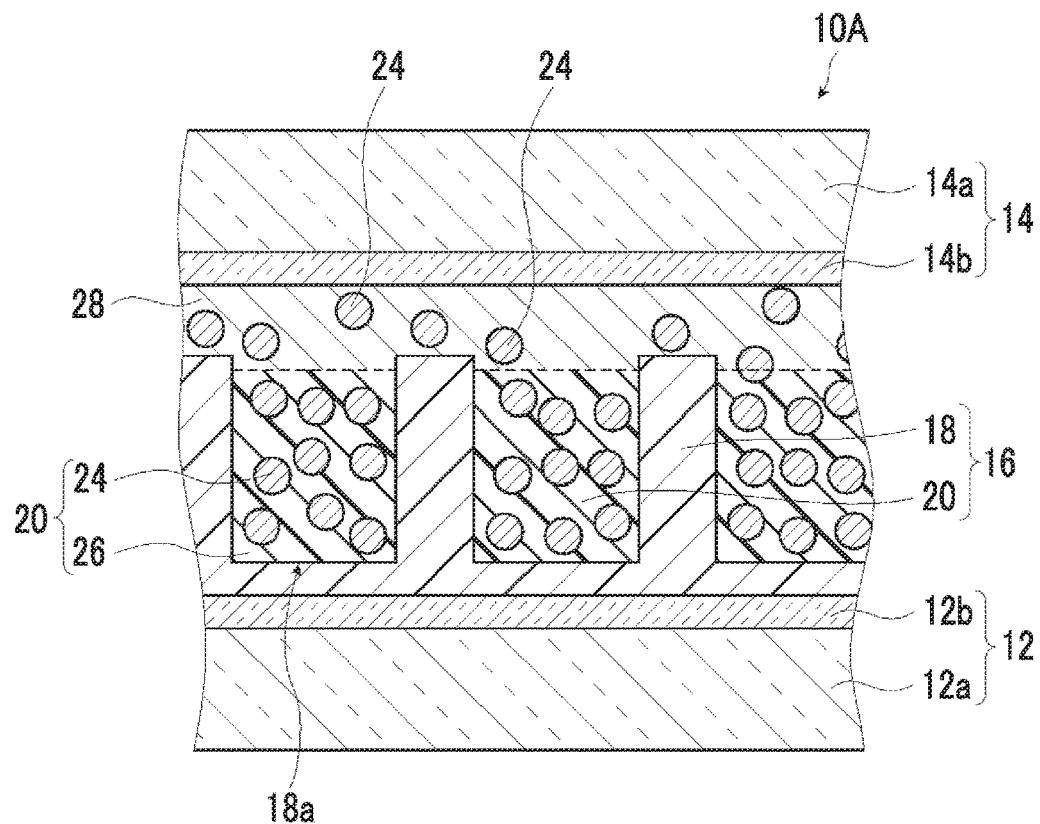
FIG. 6 is a cross-sectional view conceptually showing another example of the phosphor-containing film of the present invention.

FIG. 6 conceptually shows an example thereof in a cross-sectional view of a phosphor-containing film.

In addition, since the phosphor-containing film shown in FIG. 6 uses many members same as the above-mentioned phosphor-containing film 10, the same reference numerals are given to the same members and the description mainly focuses on different parts. In this regard, the same applies to other aspects of the present invention.

In a phosphor-containing film 10A shown in FIG. 6, the fluorescent material between the upper end of the wall portion forming the concave portion 18a and the second substrate film 14, and the fluorescent material on the upper portion of the concave portion 18a are made of a mixed layer 28 including a fluorescent material containing a material having impermeability to oxygen in addition to the fluorescent material 20 filled below the concave portion 18a. In the following description, the "material having impermeability to oxygen" may be simply referred to as an "oxygen-impermeable material".

Incorporation of such a mixed layer 28 in the phosphor-containing film 10A according to the embodiment of the present invention makes it possible to prevent oxygen from permeating through the fluorescent material between the upper end of the wall portion forming the concave portion 18a and the second substrate film 14 and to suppress deterioration of the phosphor 24 due to oxygen more suitably.

In the present invention, the oxygen-impermeable material is preferably a material with an oxygen permeability of 200 cc/m²·day·atm or less for a film in a case where this material is used to form a film having a thickness of 50 μm. The oxygen-impermeable material is more preferably a material with an oxygen permeability of 20 cc/m²·day·atm or less for a film in a case where this material is used to form a film having a thickness of 50 μm, and still more preferably a material with an oxygen permeability of 2 cc/m²·day·atm or less for a film in a case where this material is used to form a film having a thickness of 50 μm.

Specifically, various materials exemplified later as the material for forming the resin layer 18 are exemplified as the oxygen-impermeable material. Above all, the mixed layer 28 preferably contains, as the oxygen-impermeable material, a material containing the same component as the material for forming the resin layer 18. In a case where the material for forming the resin layer 18 contains an inorganic layered compound, it is preferable to use a material containing the same component as the material for forming the resin layer 18 except that it does not contain the inorganic layered compound, as the oxygen-impermeable material.

In addition, such a mixed layer 28 is not limited to the configuration which is formed between the upper end of the wall portion and the second substrate film 14, and in the upper portion of concave portion 18a, as shown in FIG. 6.

The mixed layer 28 may not be formed, for example, in the concave portion 18a, and may be formed only between the upper end of the wall portion forming the concave portion 18a and the second substrate film 14. Alternatively, it may be a configuration in which, between the upper end of the wall portion forming the concave portion 18a and the second substrate film 14, the upper portion may be of the mixed layer 28 and the lower portion may be of the fluorescent material 20.

The content of the oxygen-impermeable material in the mixed layer 28 is not particularly limited.

As the content of the oxygen-impermeable material in the mixed layer 28 increases, the deterioration of the phosphor 24 due to oxygen can be prevented. On the other hand, in a case where the content of the oxygen-impermeable material in the mixed layer 28 increases, the content of the phosphor 24 relatively decreases, so the optical properties of the mixed layer 28, that is, the optical properties of the phosphor-containing film 10A decrease.

Taking this point into consideration, the content of the oxygen-impermeable material in the mixed layer 28 may be appropriately determined according to the optical properties, durability, and the like required for the phosphor-containing film 10A.

Specifically, the content of the oxygen-impermeable material in the mixed layer 28 is preferably 40 to 90% by mass and more preferably 50 to 80% by mass.

In addition, the thickness of the mixed layer 28 is not particularly limited.

The content ratio of the phosphor 24 in the mixed layer 28 is lower than that of the fluorescent material 20. Therefore, in consideration of the optical properties of the phosphor-containing film 10A, the thickness (the size in the vertical direction) of the mixed layer 28 is preferably thinner. Conversely, in terms of preventing the deterioration of the phosphor 24, the mixed layer 28 is preferably thicker.

Therefore, the thickness of the mixed layer 28 may be appropriately set according to the optical properties, durability, and the like required for the phosphor-containing film 10A. For example, in a case where the prevention of deterioration of the phosphor 24 is important, it is preferable to use the entire area between the upper end of the wall portion forming the concave portion 18a and the second substrate film 14 as the mixed layer.

Figure 7:
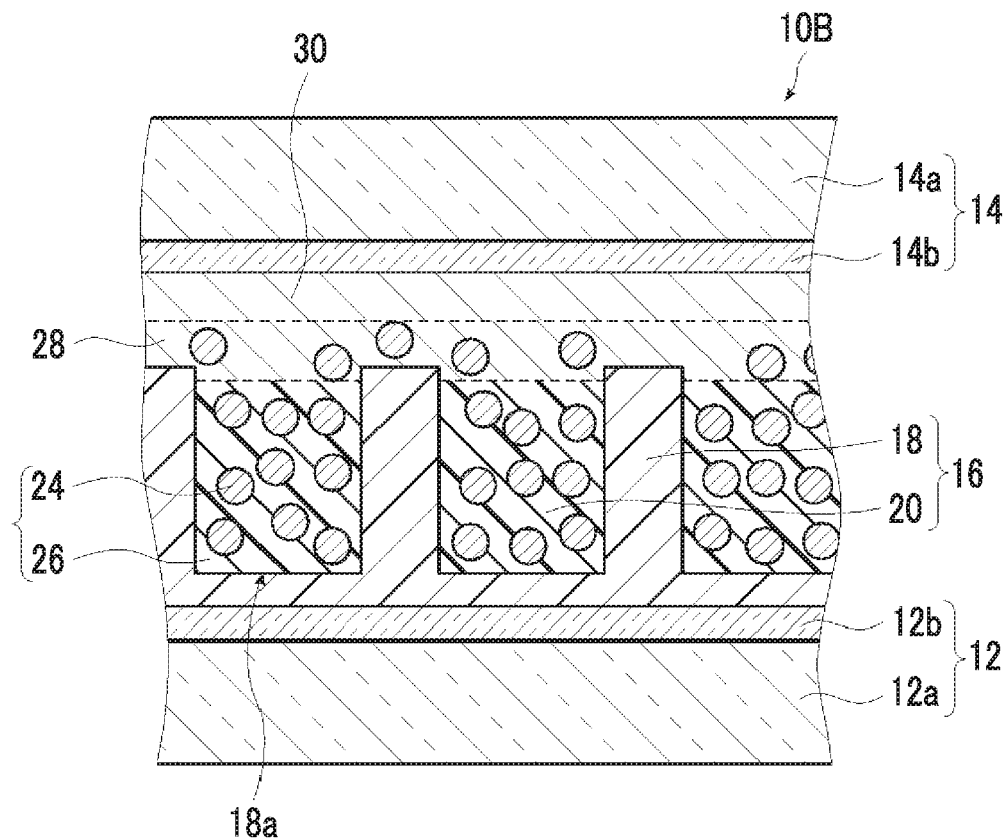
FIG. 7 is a cross-sectional view conceptually showing another example of the phosphor-containing film of the present invention.

Furthermore, as in the phosphor-containing film 10B conceptually shown in FIG. 7, the phosphor-containing film according to the embodiment of the present invention may have, in addition to such a mixed layer 28, an impermeable layer 30 which does not contain the phosphor 24 and the binder 26 and is made of the same oxygen-impermeable material as the oxygen-impermeable material contained in the mixed layer 28, between the mixed layer 28 and the second substrate film 14.

By including the impermeable layer 30, the deterioration of the phosphor 24 due to the oxygen permeated between the upper end of the wall portion and the second substrate film 14 can be more suitably prevented.

There is no particular limitation on the thickness of the impermeable layer 30 in the phosphor-containing film 10B.

The impermeable layer 30 does not have the phosphor 24 and is formed only of the oxygen-impermeable material. Therefore, the thicker one is advantageous for preventing the deterioration of the phosphor 24 due to oxygen, as in a case of the mixed layer 28 described above, but the thicker one is more disadvantageous in terms of the optical properties. Therefore, in a case where the phosphor-containing film 10B has the impermeable layer 30, the thickness of the impermeable layer 30 may also be appropriately set according to the optical properties, durability, and the like required for the phosphor-containing film 10B.

Such a mixed layer 28 or further impermeable layer 30 can be formed by various methods.

As described above, the phosphor-containing film 10 according to the embodiment of the present invention is produced in such a manner that the resin layer 18 is formed on the surface of the first substrate film 12, a coating liquid to be the fluorescent material 20 (coating liquid for forming a fluorescent material) is filled in the concave portion 18a of the resin layer 18, the second substrate film 14 is laminated on the resin layer 18 so as to seal the coating liquid filled in the resin layer 18, and then the coating liquid to be the fluorescent material 20 is cured.

As an example, in this production method, a coating liquid containing an oxygen-impermeable material is applied onto the surface on the resin layer 18 side of the second substrate film 14, before laminating the second substrate film 14. Then, the second substrate film 14 is laminated on the resin layer 18 with the coating liquid containing an oxygen-impermeable material facing the resin layer 18. Thereby, the coating liquid to be the fluorescent material 20 and the coating liquid containing an oxygen-impermeable material are mixed between the upper end of the wall portion and the second substrate film 14. Thereafter, the mixed layer 28 containing an oxygen-impermeable material in addition to the fluorescent material can be formed between the upper end of the wall portion and the second substrate film 14 by curing the coating liquid containing an oxygen-impermeable material and the coating liquid to be the fluorescent material 20.

In this case, it can be set whether to form only the mixed layer 28 or to form both the mixed layer 28 and the impermeable layer 30 by adjusting the coating thickness of the coating liquid containing an oxygen-impermeable material, which is applied to the second substrate film 14. Specifically, it is possible to form the impermeable layer 30 in addition to the mixed layer 28 by increasing the coating thickness of the coating liquid containing an oxygen-impermeable material, and the impermeable layer 30 becomes thicker as the coating thickness of the coating liquid increases.

Details on this point will be described later.

The phosphor-containing film 10 (10A, 10B) according to the embodiment of the present invention has the configuration in which the phosphor-containing layer 16 having such resin layer 18 and fluorescent material 20 is sandwiched between the first substrate film 12 and the second substrate film 14. In addition, as described above, the phosphor-containing film 10 according to the embodiment of the present invention may have the mixed layer 28 and/or the impermeable layer 30 in addition to the resin layer 18 and the fluorescent material 20.

It is preferable that both the first substrate film 12 and the second substrate film 14 have impermeability to oxygen. As a preferred aspect, in the phosphor-containing film 10, the first substrate film 12 has a configuration in which the barrier layer 12b is laminated on the support film 12a, and is laminated on the phosphor-containing layer 16 with the barrier layer 12b facing the phosphor-containing layer 16. Similarly, the second substrate film 14 also has a configuration in which the barrier layer 14b is laminated on the support film 14a, and is laminated on the phosphor-containing layer 16 with the barrier layer 14b facing the phosphor-containing layer 16.

Various known barrier layers can be used as the barrier layer 12b of the first substrate film 12 as long as they exhibit oxygen impermeability. Similarly, various known barrier layers can be used as the barrier layer 14b of the second substrate film 14 as long as they exhibit oxygen impermeability.

In addition, since the first substrate film 12 and the second substrate film 14 have the same configuration except that a lamination position is different, the following description will be made with the first substrate film 12 as a representative example, except where it is necessary to distinguish therebetween.

Various known barrier layers can be used for the barrier layer 12b of the first substrate film 12, but a barrier layer having at least one inorganic layer is preferable, and an organic-inorganic laminated barrier layer having one or more combinations of an inorganic layer and an organic layer to be an underlying layer of this inorganic layer is more preferable.

In the phosphor-containing film 10 of the illustrated example, as shown in the partially enlarged view A of FIG. 3, the barrier layer 12b of the first substrate film (the barrier layer 14b of the second substrate film 14) has a configuration in which three layers of an underlying organic layer 34 formed on the surface of the support film 12a (support film 14a), an inorganic layer 36 formed on the underlying organic layer 34, and a protective organic layer 38 formed on the inorganic layer 36 are laminated.

The surface of the support film 12a, that is, the underlying organic layer 34 under the inorganic layer 36 is an underlying layer (undercoat layer) for properly forming the inorganic layer 36. In the organic-inorganic laminated barrier layer, it is the inorganic layer 36 that mainly exhibits barrier properties. Therefore, by forming the underlying organic layer 34 and forming the inorganic layer 36 thereon, the forming surface of the inorganic layer 36 can be made appropriate and the inorganic layer 36 without defects can be formed, and the high barrier properties can be obtained.

Although the barrier layer 12b in the illustrated example has only one combination of the underlying organic layer 34 and the inorganic layer 36, the barrier layer may have a plurality of combinations of the underlying organic layer 34 and the inorganic layer 36. The more the combination of the underlying organic layer 34 and the inorganic layer 36, the higher the barrier performance can be obtained.

The protective organic layer 38 formed on the surface of the inorganic layer 36 is a protective layer (overcoat layer) that protects the inorganic layer 36 that mainly exhibits barrier properties.

By including the protective organic layer 38, it is possible to prevent cracking, chipping, and the like of the inorganic layer 36, and to prevent the barrier properties of the barrier layer 12b from being lowered due to the damage of the inorganic layer 36.

Figure 8:
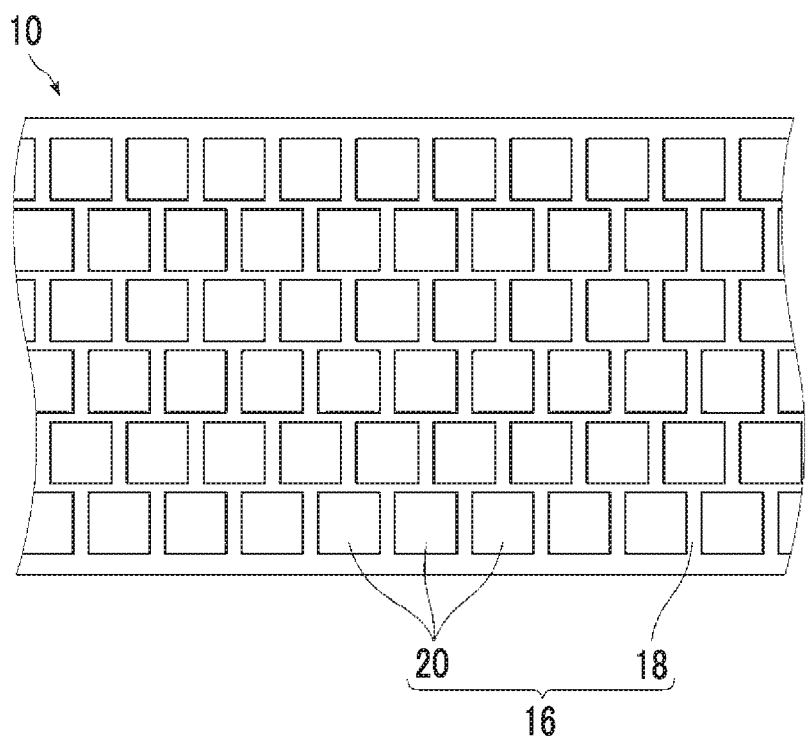
FIG. 8 is a plan view showing another example of a pattern of a fluorescent material.
Figure 9:
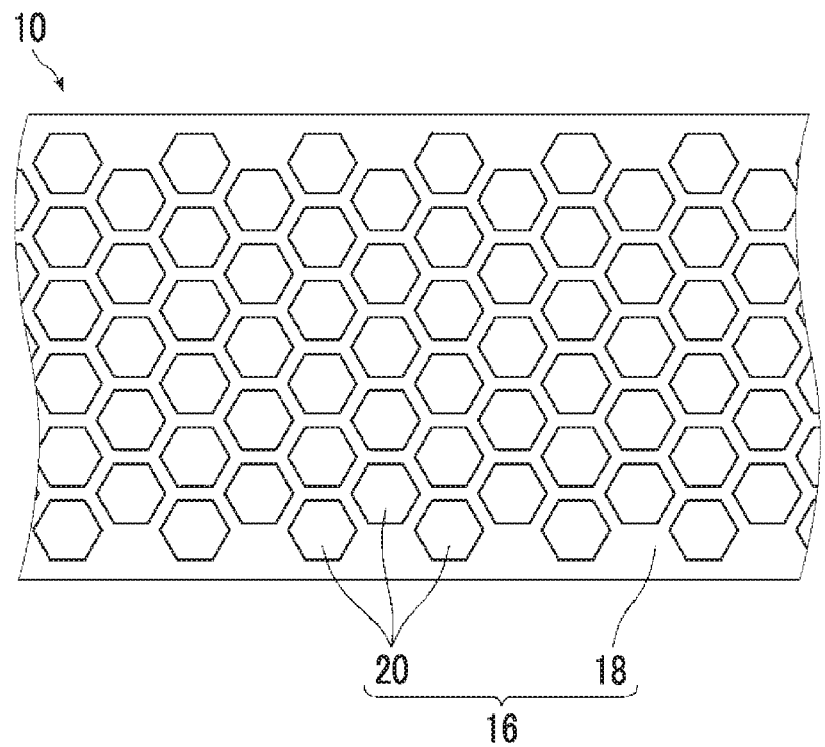
FIG. 9 is a plan view showing another example of the pattern of the fluorescent material.

In the phosphor-containing film 10 shown in FIGS. 1 to 3, the fluorescent material 20 (concave portion 18a) has a cylindrical shape and is circular in plan view, but the shape of the fluorescent material 20 is not particularly limited. For example, the fluorescent material 20 may be a polygonal prism or a regular polygonal prism such as a quadrangular in plan view as shown in FIG. 8, or a hexagon (honeycomb structure) in plan view as shown in FIG. 9. In the above example, the bottom surface of the cylinder or the polygonal prism is arranged parallel to the substrate film surface, but the bottom surface may not necessarily be arranged parallel to the substrate film surface. Further, the shape of each fluorescent material 20 may be amorphous.

Figure 10:
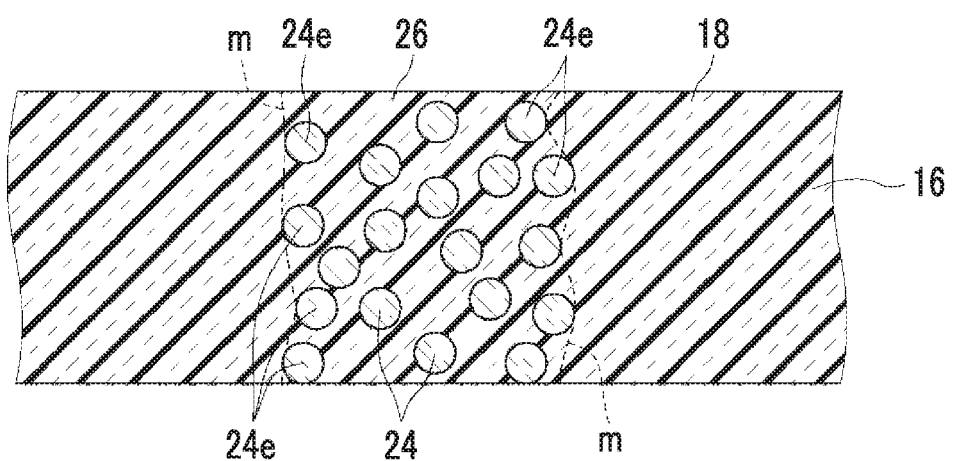
FIG. 10 is a conceptual diagram for explaining a method of specifying an outline of the fluorescent material.

In a case where the boundary between the binder 26 of the fluorescent material 20 and the resin layer 18 is not clear, as shown in FIG. 10, a line connecting the points on the outside (the side on which the phosphor 24 is not arranged) of the phosphor 24e positioned at the outermost position of the region where the phosphor 24 is closely arranged is considered as the contour m of the fluorescent material 20 (the boundary between the fluorescent material 20 and the resin layer 18). The position of the phosphor can be specified by irradiation of the phosphor-containing layer with excitation light to cause the phosphor to emit light, followed by observation with, for example, a confocal laser microscope or the like, whereby the contour m of the fluorescent material 20 can be specified. In the present specification, the side of a cylinder or a polygonal prism is allowed to meander like the contour in FIG. 10.

In the above embodiment, the fluorescent material 20 is periodically arranged in a pattern, but it may be non-periodic as long as the desired performance is not impaired in a case where a plurality of fluorescent materials 20 are discretely arranged. It is preferable that the fluorescent material 20 is uniformly distributed over the entire region of the phosphor-containing layer 16 because the in-plane distribution of luminance is uniform.

In order to obtain a sufficient amount of fluorescence, it is desirable to make the region occupied by the fluorescent material 20 as large as possible.

The phosphor 24 in the fluorescent material 20 may be of one kind or of plural kinds. In addition, the phosphor 24 in one fluorescent material 20 is regarded as one kind, and in a case where there are a plurality of fluorescent materials 20, a region containing a first phosphor and a region containing a second phosphor different from the first phosphor may be arranged periodically or non-periodically. The kind of the phosphor may be three or more.

As described above, in the phosphor-containing film according to the embodiment of the present invention, the shape of the fluorescent material 20 and the arrangement pattern thereof are not particularly limited. The fluorescent regions are discretely arranged on the film surface in any case, so that the phosphor in the fluorescent material at the cut end portion deteriorates but the fluorescent material in the portion other than the cut end portion is sealed by being surrounded with an oxygen-impermeable resin in the direction along the film surface. Consequently, it is possible to suppress deterioration in performance due to the penetration of oxygen from the direction along the film surface.

Hereinafter, individual constituent elements of the phosphor-containing film according to the embodiment of the present invention will be described.

As described above, the phosphor-containing film 10 shown in FIGS. 1 to 3 has a configuration in which the phosphor-containing layer 16 is laminated on one film surface of the first substrate film 12 and the second substrate film 14 is laminated on the phosphor-containing layer 16, so the phosphor-containing layer 16 is sandwiched between the first substrate films 12 and the second substrate film 14.

Phosphor-Containing Layer

The phosphor-containing layer 16 has a fluorescent material 20 containing a plurality of phosphors 24 and a resin layer 18 discretely having concave portions 18a filled with the fluorescent material 20. The resin layer 18 preferably has impermeability to oxygen.

Fluorescent Material

The fluorescent material 20 is constituted basically of a phosphor 24 and a binder 26 in which the phosphor 24 is dispersed and is formed by applying and curing a coating liquid for forming a fluorescent material containing the phosphor 24 and a curable composition to be the binder 26.

Phosphor

Various known phosphors can be used as the phosphor 24. Examples of the phosphor include inorganic phosphors such as rare earth doped garnet, silicates, aluminates, phosphates, ceramic phosphors, sulfide phosphors, and nitride phosphors, and organic fluorescent substances including organic fluorescent dyes and organic fluorescent pigments. In addition, phosphors with rare earth-doped semiconductor fine particles, and semiconductor nanoparticles (quantum dots and quantum rods) are also suitably used. A single kind of phosphor may be used alone, but a plurality of phosphors having different wavelengths may be mixed and used so as to obtain a desired fluorescence spectrum, or a combination of phosphors of different material constitutions may be used. The combination of phosphors of different material constitutions may be, for example, a combination of a rare earth doped garnet and quantum dots.

Many of these phosphors react with oxygen and deteriorate upon exposure to oxygen. As used herein, the phrase "exposure to oxygen" means exposure to an environment containing oxygen, such as in the atmosphere, and the phrase "deteriorates by being reacted with oxygen" means that the phosphor is oxidized so that the performance of the phosphor deteriorates (decreases) and refers to mainly the luminescence performance declining as compared with that before the reaction with oxygen, and in a case where the phosphor is used as a photoelectric conversion element, such a phrase means that the photoelectric conversion efficiency declines as compared with that before the reaction with oxygen.

In the present invention, the fluorescent material 20 is filled in the concave portions 18a discretely formed in the resin layer 18, and preferably, the resin layer 18 has impermeability to oxygen. Therefore, a material such as a quantum dot that is capable of reacting with oxygen and being deteriorated upon exposure to oxygen is suitably used as the phosphor 24.

In the following description, as the phosphor 24, mainly quantum dots will be described as an example. However, the phosphor 24 used for the present invention is not limited to quantum dots and is not particularly limited as long as it is a fluorescent coloring agent, or a material that converts energy from the outside into light or converts light into electricity, such as a photoelectric conversion material.

Quantum Dot

The quantum dot is a fine particle of a compound semiconductor having a size of several nm to several tens of nm and is at least excited by incident excitation light to emit fluorescence.

The phosphor 24 of the present embodiment may include at least one quantum dot or may include two or more quantum dots having different luminescence properties. Known quantum dots include a quantum dot (A) having a luminescence center wavelength in a wavelength range of 600 to 680 nm, a quantum dot (B) having a luminescence center wavelength in a wavelength range of 500 nm or more to less than 600 nm, and a quantum dot (C) having a luminescence center wavelength in a wavelength range of 400 nm or more to less than 500 nm, and the quantum dot (A) is excited by excitation light to emit red light, the quantum dot (B) is excited by excitation light to emit green light, and the quantum dot (C) is excited by excitation light to emit blue light.

For example, in a case where blue light is incident as excitation light to a phosphor-containing layer 16 containing the quantum dot (A) and the quantum dot (B), red light emitted from the quantum dot (A), green light emitted from the quantum dot (B) and blue light penetrating through the phosphor-containing layer can realize white light. Alternatively, ultraviolet light can be incident as excitation light to a phosphor-containing layer 16 containing the quantum dots (A), (B), and (C), thereby allowing red light emitted from the quantum dot (A), green light emitted from the quantum dot (B), and blue light emitted from the quantum dot (C) to realize white light.

With respect to the quantum dot, reference can be made to, for example, paragraphs [0060] to [0066] of JP2012-169271A, but the quantum dot is not limited to those described therein. As the quantum dot, commercially available products can be used without any limitation. The luminescence wavelength of the quantum dot can usually be adjusted by the composition and size of the particles.

The quantum dots can be added in an amount of, for example, about 0.1 to 10 parts by mass with respect to 100 parts by mass of the total amount of the coating liquid for forming a fluorescent material.

The quantum dots may be added into the coating liquid for forming a fluorescent material in the state of particles or in the state of a dispersion liquid in which the quantum dots are dispersed in an organic solvent. It is preferable that the quantum dots be added in the state of a dispersion liquid, from the viewpoint of suppressing aggregation of quantum dot particles. The organic solvent used for dispersing the quantum dots is not particularly limited.

As the quantum dots, for example, core-shell type semiconductor nanoparticles are preferable from the viewpoint of improving durability. As the core, Group II-VI semiconductor nanoparticles, Group III-V semiconductor nanoparticles, multi-component semiconductor nanoparticles, and the like can be used. Specific examples thereof include, but are not limited to, CdSe, CdTe, CdS, ZnS, ZnSe, ZnTe, InP, InAs, and InGaP. Among them, CdSe, CdTe, InP, and InGaP are preferable from the viewpoint of emitting visible light with high efficiency. As the shell, CdS, ZnS, ZnO, GaAs, and complexes thereof can be used, but it is not limited thereto.

The luminescence wavelength of the quantum dot can usually be adjusted by the composition and size of the particles.

The quantum dot may be a spherical particle or may be a rod-like particle also called a quantum rod, or may be a tetrapod-type particle. A spherical quantum dot or rod-like quantum dot (that is, a quantum rod) is preferable from the viewpoint of narrowing a full width at half maximum (FWHM) and enlarging the color reproduction range of a liquid crystal display device.

A ligand having a Lewis basic coordinating group may be coordinated on the surface of the quantum dot. It is also possible to use quantum dots in which such a ligand is already coordinated. Examples of the Lewis basic coordinating group include an amino group, a carboxy group, a mercapto group, a phosphine group, and a phosphine oxide group. Specific examples thereof include hexylamine, decylamine, hexadecylamine, octadecylamine, oleylamine, myristylamine, laurylamine, oleic acid, mercaptopropionic acid, trioctylphosphine, and trioctylphosphine oxide. Among these, hexadecylamine, trioctylphosphine, and trioctylphosphine oxide are preferable, and trioctylphosphine oxide is particularly preferable.

Quantum dots in which these ligands are coordinated can be produced by a known synthesis method. For example, such quantum dots can be synthesized by the method described in C. B. Murray, D. J. Norris, M. G. Bawendi, Journal American Chemical Society, 1993, 115(19), pp. 8706 to 8715, or The Journal Physical Chemistry, 101, pp. 9463 to 9475, 1997. In addition, commercially available quantum dots in which the ligands are coordinated can be used without any limitation. For example, Lumidot (manufactured by Sigma-Aldrich Co. LLC.) can be mentioned.

In the present invention, the content of the ligand-coordinated quantum dots is preferably 0.01% to 10% by mass and more preferably 0.05% to 5% by mass with respect to the total mass of the polymerizable compound contained in the coating liquid for forming a fluorescent material to be the fluorescent material 20. It is desirable to adjust the concentration, depending on the thickness of the phosphor-containing film.

The quantum dots may be added to the coating liquid for forming a fluorescent material in the state of particles or in the state of a dispersion liquid dispersed in a solvent. It is preferable to add the quantum dots in the state of a dispersion liquid from the viewpoint of suppressing aggregation of particles of quantum dots. The solvent used here is not particularly limited.

Method for Synthesizing Ligand

The ligand in the coating liquid for forming a fluorescent material can be synthesized by a known synthesis method. For example, the ligand can be synthesized by the method described in JP2007-277514A.

Curable Composition for Forming Binder of Fluorescent Material

In the present invention, the curable composition for forming the binder 26 of the fluorescent material 20 preferably contains a polymerizable compound. In addition, the curable composition for forming the binder 26 of the fluorescent material 20 preferably contains a polymer dispersant.

Polymerizable Compound

The polymerizable compound is preferably an acrylic compound. A monofunctional or polyfunctional (meth)acrylate monomer is preferable, and a prepolymer or polymer of a monomer may be used as long as it has polymerizability.

Monofunctional Ones

A monofunctional (meth)acrylate monomer may be, for example, acrylic acid or methacrylic acid, or derivatives thereof, more specifically, a monomer having one polymerizable unsaturated bond ((meth)acryloyl group) of (meth) acrylic acid in the molecule. Specific examples thereof include the following compounds, but the present embodiment is not limited thereto.

Examples thereof include alkyl (meth)acrylates having 1 to 30 carbon atoms in the alkyl group, such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, and stearyl (meth)acrylate; aralkyl (meth)acrylates having 7 to 20 carbon atoms in the aralkyl group, such as benzyl (meth)acrylate; alkoxyalkyl (meth)acrylates having 2 to 30 carbon atoms in the alkoxyalkyl group, such as butoxyethyl (meth)acrylate; aminoalkyl (meth)acrylates having 1 to 20 carbon atoms in total in the (monoalkyl or dialkyl)aminoalkyl group, such as N,N-dimethylaminoethyl (meth)acrylate; polyalkylene glycol alkyl ether (meth)acrylates having 1 to 10 carbon atoms in the alkylene chain and having 1 to 10 carbon atoms in the terminal alkyl ether, such as diethylene glycol ethyl ether (meth)acrylate, triethylene glycol butyl ether(meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, and tetraethylene glycol monoethyl ether (meth)acrylate; polyalkylene glycol aryl ether (meth)acrylates having 1 to 30 carbon atoms in the alkylene chain and having 6 to 20 carbon atoms in the terminal aryl ether, such as hexaethylene glycol phenyl ether (meth)acrylate; (meth) acrylates having an alicyclic structure and having 4 to 30 carbon atoms in total, such as cyclohexyl (meth)acrylate, dicyclopentanyl (meth)acrylate, isobornyl (meth)acrylate, and methylene oxide addition cyclodecatriene (meth)acrylate; fluorinated alkyl (meth)acrylates having 4 to 30 carbon atoms in total, such as heptadecafluorodecyl (meth)acrylate; (meth)acrylates having a hydroxyl group, such as 2-hydroxyethyl (meth)acrylate, 3-hydroxypropyl (meth)acrylate, 4-hydroxybutyl (meth)acrylate, triethylene glycol mono (meth)acrylate, tetraethylene glycol mono(meth)acrylate, hexaethylene glycol mono(meth)acrylate, octapropylene glycol mono(meth)acrylate, and glycerol mono or di(meth) acrylate; (meth)acrylates having a glycidyl group, such as glycidyl (meth)acrylate; polyethylene glycol mono(meth) acrylates having 1 to 30 carbon atoms in the alkylene chain, such as tetraethylene glycol mono(meth)acrylate, hexaethylene glycol mono(meth)acrylate, and octapropylene glycol mono(meth)acrylate; and (meth)acrylamides such as (meth) acrylamide, N,N-dimethyl (meth)acrylamide, N-isopropyl (meth)acrylamide, 2-hydroxyethyl (meth)acrylamide, and acryloylmorpholine.

The amount of the monofunctional (meth)acrylate monomer to be used is preferably 10 parts by mass or more and more preferably 10 to 80 parts by mass with respect to 100 parts by mass of the total amount of the curable compound contained in the coating liquid for forming a fluorescent material, from the viewpoint of adjusting the viscosity of the coating liquid to a preferable range.

Difunctional Ones

The polymerizable monomer having two polymerizable groups may be, for example, a difunctional polymerizable unsaturated monomer having two ethylenically unsaturated bond-containing groups. The difunctional polymerizable unsaturated monomer is suitable for allowing a composition to have a low viscosity. In the present embodiment, preferred is a (meth)acrylate-based compound which is excellent in reactivity and which has no problems associated with a remaining catalyst and the like.

In particular, neopentyl glycol di(meth)acrylate, 1,9-nonanediol di(meth)acrylate, dipropylene glycol di(meth) acrylate, tripropylene glycol di(meth)acrylate, tetraethylene glycol di(meth)acrylate, hydroxypivalate neopentyl glycol di(meth)acrylate, polyethylene glycol di(meth)acrylate, dicyclopentenyl(meth)acrylate, dicyclopentenyloxyethyl (meth)acrylate, dicyclopentanyl di(meth)acrylate, or the like is suitably used in the present invention.

The amount of the difunctional (meth)acrylate monomer to be used is preferably 5 parts by mass or more and more preferably 10 to 80 parts by mass with respect to 100 parts by mass of the total amount of the curable compound contained in the coating liquid for forming a fluorescent material, from the viewpoint of adjusting the viscosity of the coating liquid to a preferable range.

Tri- or Higher Functional Ones

The polymerizable monomer having three or more polymerizable groups may be, for example, a polyfunctional polymerizable unsaturated monomer having three or more ethylenically unsaturated bond-containing groups. Such a polyfunctional polymerizable unsaturated monomer is excellent in terms of imparting mechanical strength. In the present embodiment, preferred is a (meth)acrylate-based compound which is excellent in reactivity and which has no problems associated with a remaining catalyst and the like.

Specifically, epichlorohydrin (ECH)-modified glycerol tri (meth)acrylate, ethylene oxide (EO)-modified glycerol tri (meth)acrylate, propylene oxide (PO)-modified glycerol tri (meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritolhexa(meth)acrylate, dipentaerythritolpenta (meth)acrylate, caprolactone-modified dipentaerythritolhexa(meth)acrylate, dipentaerythritolhydroxypenta(meth)acrylate, alkyl-modified dipentaerythritolpenta(meth)acrylate, dipentaerythritol poly(meth)acrylate, alkyl-modified dipentaerythritol tri(meth)acrylate, ditrimethylolpropane tetra(meth)acrylate, pentaerythritolethoxy tetra(meth)acrylate, pentaerythritol tetra(meth)acrylate, or the like is suitable.

Among them, EO-modified glycerol tri(meth)acrylate, PO-modified glycerol tri(meth)acrylate, trimethylolpropane tri(meth)acrylate, EO-modified trimethylolpropane tri (meth)acrylate, PO-modified trimethylolpropane tri(meth) acrylate, dipentaerythritolhexa(meth)acrylate, dipentaerythritolpenta(meth)acrylate, pentaerythritolethoxy tetra(meth) acrylate, or pentaerythritol tetra(meth)acrylate is suitably used in the present invention.

The amount of the polyfunctional (meth)acrylate monomer to be used is preferably 5 parts by mass or more from the viewpoint of the coating film hardness of the fluorescent-containing layer after curing, and preferably 95 parts by mass or less from the viewpoint of suppressing gelation of the coating liquid, with respect to 100 parts by mass of the total amount of the curable compound contained in the coating liquid for forming a fluorescent material.

From the viewpoint of further improving the heat resistance of the fluorescent material 20 (binder 26), the (meth) acrylate monomer is preferably an alicyclic acrylate. Examples of such a monofunctional (meth)acrylate monomer include dicyclopentenyl (meth)acrylate, dicyclopentanyl (meth)acrylate, and dicyclopentenyloxyethyl (meth) acrylate. Examples of the difunctional (meth)acrylate monomer include tricyclodecanedimethanol di(meth)acrylate.

The total amount of the polymerizable compound in the curable composition forming the binder 26 is preferably 70 to 99 parts by mass and more preferably 85 to 97 parts by mass with respect to 100 parts by mass of the curable composition, from the viewpoint of handleability and curability of the composition.

Epoxy-Based Compounds

The polymerizable monomer may be, for example, a compound having a cyclic group such as a ring-opening polymerizable cyclic ether group such as an epoxy group or an oxetanyl group. Such a compound may be more preferably, for example, a compound having a compound (epoxy compound) having an epoxy group. Use of the compound having an epoxy group and/or an oxetanyl group in combination with the (meth)acrylate-based compound tends to improve adhesion to the barrier layer.

Examples of the compound having an epoxy group include polyglycidyl esters of polybasic acids, polyglycidyl ethers of polyhydric alcohols, polyglycidyl ethers of polyoxyalkylene glycols, polyglycidylesters of aromatic polyols, hydrogenated compounds of polyglycidyl esters of aromatic polyols, polyglycidyl ethers of aromatic polyols, urethane polyepoxy compounds, and epoxidized polybutadienes. These compounds may be used alone or in combination of two or more thereof.

Examples of other compounds having an epoxy group, which may be preferably used, include aliphatic cyclic epoxy compounds, bisphenol A diglycidyl ethers, bisphenol F diglycidyl ethers, bisphenol S diglycidyl ethers, brominated bisphenol A diglycidyl ethers, brominated bisphenol F diglycidyl ethers, brominated bisphenol S diglycidyl ethers, hydrogenated bisphenol A diglycidyl ethers, hydrogenated bisphenol F diglycidyl ethers, hydrogenated bisphenol S diglycidyl ethers, 1,4-butanediol diglycidyl ethers, 1,6-hexanediol diglycidyl ethers, glycerin triglycidyl ethers, trimethylolpropane triglycidyl ethers, polyethylene glycol diglycidyl ethers, and polypropylene glycol diglycidyl ethers; polyglycidyl ethers of polyether polyols, obtained by adding one or two or more alkylene oxides to an aliphatic polyhydric alcohol such as ethylene glycol, propylene glycol, or glycerin; diglycidyl esters of aliphatic long chain dibasic acids; monoglycidyl ethers of aliphatic higher alcohols; monoglycidyl ethers of polyether alcohols, obtained by adding an alkylene oxide to phenol, cresol, butyl phenol, or these compounds; and glycidyl esters of higher fatty acids.

Among these components, aliphatic cyclic epoxy compounds, bisphenol A diglycidyl ethers, bisphenol F diglycidyl ethers, hydrogenated bisphenol A diglycidyl ethers, hydrogenated bisphenol F diglycidyl ethers, 1,4-butanediol diglycidyl ethers, 1,6-hexanediol diglycidyl ethers, glycerin triglycidyl ethers, trimethylolpropane triglycidyl ethers, neopentyl glycol diglycidyl ethers, polyethylene glycol diglycidyl ethers, and polypropylene glycol diglycidyl ethers are preferable.

Examples of commercially available products which can be suitably used as the compound having an epoxy group and/or an oxetanyl group include UVR-6216 (manufactured by Union Carbide Corporation), glycidol, AOEX24, CYCLOMER A200, CELLOXIDE 2021P and CELLOXIDE 8000 (all manufactured by Daicel Corporation), 4-vinylcyclohexene dioxide manufactured by Sigma-Aldrich LLC., EPIKOTE 828, EPIKOTE 812, EPIKOTE 1031, EPIKOTE 872 and EPIKOTE CT508 (all manufactured by Yuka Shell Epoxy K.K.), and KRM-2400, KRM-2410, KRM-2408, KRM-2490, KRM-2720 and KRM-2750 (all manufactured by Asahi Denka Kogyo K.K.). These compounds may be used alone or in combination of two or more thereof.

Although there are no particular restrictions on the production method of such a compound having an epoxy group and/or an oxetanyl group, the compound can be synthesized with reference to, for example, Literatures such as Fourth Edition Experimental Chemistry Course 20 Organic Synthesis II, p. 213~, 1992, published by Maruzen KK; Ed. by Alfred Hasfner, The chemistry of heterocyclic compounds-Small Ring Heterocycles part 3 Oxiranes, John & Wiley and Sons, An Interscience Publication, New York, 1985, Yoshimura, Adhesion, Vol. 29, No. 12, 32, 1985, Yoshimura, Adhesion, Vol. 30, No. 5, 42, 1986, Yoshimura, Adhesion, Vol. 30, No. 7, 42, 1986, JP1999-100378A (JP-H11-100378A), JP2906245B, and JP2926262B.

A vinyl ether compound may be used as the curable compound.

As the vinyl ether compound, a known vinyl ether compound can be appropriately selected, and, for example, the compound described in paragraph [0057] of JP2009-073078A may be preferably adopted.

Such a vinyl ether compound can be synthesized by, for example, the method described in Stephen. C. Lapin, Polymers Paint Colour Journal. 179 (4237), 321 (1988), namely, by a reaction of a polyhydric alcohol or a polyhydric phenol with acetylene, or a reaction of a polyhydric alcohol or a polyhydric phenol with a halogenated alkyl vinyl ether, and such method and reactions may be used alone or in combination of two or more thereof.

For the coating liquid for forming a fluorescent material, a silsesquioxane compound having a reactive group described in JP2009-073078A can also be used from the viewpoint of a decrease in viscosity and an increase in hardness.

Among the foregoing curable compounds, a (meth)acrylate compound is preferable from the viewpoint of composition viscosity and photocuring properties, and acrylate is more preferable. In the present invention, a polyfunctional polymerizable compound having two or more polymerizable functional groups is preferable. In the present invention, particularly, the compounding ratio of the monofunctional (meth)acrylate compound to the polyfunctional (meth)acrylate compound is preferably 80/20 to 0/100, more preferably 70/30 to 0/100, and still more preferably 40/60 to 0/100 in terms of mass ratio. By selecting an appropriate ratio, it is possible to provide sufficient curability and make the composition low in viscosity.

The ratio of the difunctional (meth)acrylate to the tri- or higher functional (meth)acrylate in such a polyfunctional (meth)acrylate compound is preferably 100/0 to 20/80, more preferably 100/0 to 50/50, and still more preferably 100/0 to 70/30 in terms of mass ratio. Since the tri- or higher functional (meth)acrylate has a higher viscosity than the difunctional (meth)acrylate, a larger amount of the difunctional (meth)acrylate is preferable because the viscosity of the curable compound for a resin layer having impermeability to oxygen in the present invention can be lowered.

From the viewpoint of enhancing the impermeability to oxygen, it is preferable to include a compound containing a substituent having an aromatic structure and/or an alicyclic hydrocarbon structure as the polymerizable compound. The polymerizable compound having an aromatic structure and/or an alicyclic hydrocarbon structure is more preferably contained in an amount of 50% by mass or more and still more preferably 80% by mass or more. The polymerizable compound having an aromatic structure is preferably a (meth)acrylate compound having an aromatic structure. As the (meth)acrylate compound having an aromatic structure, a monofunctional (meth)acrylate compound having a naphthalene structure, such as 1- or 2-naphthyl (meth)acrylate, 1- or 2-naphthylmethyl (meth)acrylate, or 1- or 2-naphthylethyl (meth)acrylate, a monofunctional acrylate having a substituent on the aromatic ring, such as benzyl acrylate, and a difunctional acrylate such as catechol diacrylate or xylylene glycol diacrylate are preferable. As the polymerizable compound having an alicyclic hydrocarbon structure, isobornyl (meth)acrylate, dicyclopentanyl (meth)acrylate, dicyclopentanyloxyethyl (meth)acrylate, dicyclopentenyl (meth)acrylate, adamantyl (meth)acrylate, tricyclodecanyl (meth)acrylate, tetracyclododecanyl (meth)acrylate, and the like are preferable.

In addition, in a case where (meth)acrylate is used as the polymerizable compound, acrylate is preferable to methacrylate from the viewpoint of excellent curability.

Polymerization Initiator

The coating liquid for forming a fluorescent material may contain a known polymerization initiator as a polymerization initiator. With respect to the polymerization initiator, for example, reference can be made to paragraph [0037] of JP2013-043382A. The content of the polymerization initiator is preferably 0.1 mol % or more and more preferably 0.5 to 2 mol % based on the total amount of the curable compound contained in the coating liquid. In addition, the polymerization initiator is preferably contained in an amount of 0.1% to 10% by mass and more preferably 0.2% to 8% by mass in terms of mass % in the total curable composition excluding the volatile organic solvent.

Photopolymerization Initiator

The coating liquid for forming a fluorescent material preferably contains a photopolymerization initiator. Any photopolymerization initiator may be used as long as it is a compound capable of generating an active species that polymerizes the polymerizable compound upon irradiation with light. Examples of the photopolymerization initiator include a cationic polymerization initiator and a radical polymerization initiator, among which a radical polymerization initiator is preferable. Further, in the present invention, a plurality of photopolymerization initiators may be used in combination.

The content of the photopolymerization initiator is, for example, 0.01% to 15% by mass, preferably 0.1% to 12% by mass, and more preferably 0.2% to 7% by mass, in the total composition excluding the solvent. In a case where two or more photopolymerization initiators are used, the total content thereof falls within the above range.

In a case where the content of the photopolymerization initiator is 0.01% by mass or more, sensitivity (fast curability) and coating film hardness tend to improve, which is preferable. On the other hand, in a case where the content of the photopolymerization initiator is 15% by mass or less, light transmittance, colorability, handleability, and the like tend to improve, which is preferable. In a system including a dye and/or a pigment, they may act as a radical trapping agent and affect photopolymerizability and sensitivity. In consideration of this point, in these applications, the addition amount of the photopolymerization initiator is optimized. On the other hand, in the composition used in the present invention, the dye and/or pigment is not an essential component, and the optimum range of the photopolymerization initiator may be different from that in the field of a curable composition for liquid crystal display color filter, or the like.

As the radical photopolymerization initiator, for example, a commercially available initiator can be used. The examples thereof include those described, for example, in paragraph [0091] of JP2008-105414A, which are preferably used. Among them, an acetophenone-based compound, an acylphosphine oxide-based compound, and an oxime ester-based compound are preferable from the viewpoint of curing sensitivity and absorption properties.

The acetophenone-based compound may be preferably, for example, hydroxyacetophenone-based compound, a dialkoxyacetophenone-based compound, and an aminoacetophenone-based compound. The hydroxyacetophenone-based compound may be preferably, for example, IRGACURE (registered trademark) 2959 (1-[4-(2-hydroxyethoxy)phenyl]-2-hydroxy-2-methyl-1-propan-1-one, IRGACURE (registered trademark) 184 (1-hydroxycyclohexyl phenylketone), IRGACURE (registered trademark) 500 (1-hydroxycyclohexyl phenylketone, benzophenone), and Darocur (registered trademark) 1173 (2-hydroxy-2-methyl-1-phenyl-1-propan-1-one), all of which are commercially available from BASF Corporation. The dialkoxyacetophenone-based compound may be preferably, for example, IRGACURE (registered trademark) 651 (2,2-dimethoxy-1,2-diphenylethan-1-one) which is commercially available from BASF Corporation.

The aminoacetophenone-based compound may be preferably, for example, IRGACURE (registered trademark) 369 (2-benzyl-2-dimethylamino-1-(4-morpholinophenyl)butanone-1), IRGACURE (registered trademark) 379 (EG) (2-dimethylamino-2-(4-methylbenzyl)-1-(4-morpholin-4-yl phenyl)butan-1-one, and IRGACURE (registered trademark) 907 (2-methyl-1-[4-methylthiophenyl]-2-morpholinopropan-1-one), all of which are commercially available from BASF Corporation.

The acylphosphine oxide-based compound may be preferably, for example, IRGACURE (registered trademark) 819 (bis(2,4,6-trimethylbenzoyl)phenylphosphine oxide), and IRGACURE (registered trademark) 1800 (bis(2,6-dimethoxybenzoyl)-2,4,4-trimethyl-pentylphosphine oxide), all of which are commercially available from BASF Corporation, and Lucirin TPO (2,4,6-trimethylbenzoyldiphenylphosphine oxide) and Lucirin TPO-L (2,4,6-trimethylbenzoylphenylethoxyphosphine oxide), both of which are commercially available from BASF Corporation.

The oxime ester-based compound may be preferably, for example, IRGACURE (registered trademark) OXE01 (1,2-octanedione, 1-[4-(phenylthio)phenyl]-2-(O-benzoyloxime)), IRGACURE (registered trademark) OXE02 (ethanone, 1-[9-ethyl-6-(2-methylbenzoyl)-9H-carbazol-3-yl]-, and 1-(O-acetyloxime)), all of which are commercially available from BASF Corporation.

The cationic photopolymerization initiator is preferably a sulfonium salt compound, an iodonium salt compound, an oxime sulfonate compound, or the like, and examples thereof include 4-methylphenyl[4-(1-methylethyl)phenyliodoniumtetrakis(pentafluorophenyl)borate (PI 2074, manufactured by Rhodia), 4-methylphenyl[4-(2-methylpropyl)phenyliodonium hexafluorophosphate (IRGACURE 250, manufactured by BASF Corporation), and IRGACURE PAG103, 108, 121, and 203 (all manufactured by BASF Corporation).

The photopolymerization initiator needs to be selected appropriately with respect to the wavelength of the light source to be used, but it is preferable that the photopolymerization initiator does not generate gas during mold pressurization/exposure. In a case where gas is generated, the mold is contaminated, so it is necessary to frequently wash the mold, or the photocurable composition is deformed in the mold, which contributes to problems such as deterioration of transfer pattern accuracy.

The curable composition to be the binder 26 contained in the coating liquid for forming a fluorescent material is preferably a radical polymerizable curable composition in which the polymerizable compound is a radical polymerizable compound and the photopolymerization initiator is a radical polymerization initiator that generates a radical upon light irradiation.

Polymer

The coating liquid for forming a fluorescent material may contain a polymer. Examples of the polymer include poly(meth)acrylate, poly(meth)acrylamide, polyester, polyurethane, polyurea, polyamide, polyether, and polystyrene.

Other Additives

The coating liquid for forming a fluorescent material may contain a viscosity adjuster, a silane coupling agent, a surfactant, an antioxidant, an oxygen getter, a polymerization inhibitor, an inorganic particle, light scattering particles, and the like.

Viscosity Adjuster

The coating liquid for forming a fluorescent material may contain a viscosity adjuster, if necessary. Addition of a viscosity adjuster makes it possible to adjust to the desired viscosity. The viscosity adjuster is preferably a filler having a particle diameter of 5 to 300 nm. In addition, the viscosity adjuster may be a thixotropic agent. In the present invention and the present specification, the term "thixotropy" refers to a property of decreasing the viscosity with increasing shear rate in a liquid composition, and the term "thixotropic agent" refers to a material having a function of imparting thixotropy to a composition by incorporation thereof into a liquid composition. Specific examples of the thixotropic agent include fumed silica, alumina, silicon nitride, titanium dioxide, calcium carbonate, zinc oxide, talc, mica, feldspar, kaolinite (kaolin clay), pyrophyllite (pyrophyllite clay), sericite (silk mica), bentonite, smectite-vermiculites (montmorillonite, beidellite, nontronite, saponite, and the like), organic bentonite, and organic smectite.

Silane Coupling Agent

The coating liquid for forming a fluorescent material may contain a silane coupling agent. The phosphor-containing layer 16 formed from the coating liquid for forming a fluorescent material containing a silane coupling agent can exhibit excellent durability due to having strong adhesion to an adjacent layer by means of the silane coupling agent. In addition, in a case where the silane coupling agent has a reactive functional group such as a radical polymerizable group, the formation of a crosslinking structure with a monomer component constituting the phosphor-containing layer can also contribute to an improvement in adhesion to the layer adjacent to the phosphor-containing layer.

For the silane coupling agent, a known silane coupling agent can be used without any limitation. From the viewpoint of adhesion, a preferred silane coupling agent may be, for example, a silane coupling agent represented by General Formula (1) described in JP2013-043382A.

General Formula (1)

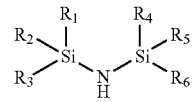

(In General Formula (1), $R_1$ to $R_6$ are each independently a substituted or unsubstituted alkyl group or aryl group, provided that at least one of $R_1$, ..., or $R_6$ is a substituent containing a radical polymerizable carbon-carbon double bond.)

$R_1$ to $R_6$ are preferably an unsubstituted alkyl group or an unsubstituted aryl group, except for a case where $R_1$ to $R_6$ are a substituent containing a radical polymerizable carbon-carbon double bond. The alkyl group is preferably an alkyl group having 1 to 6 carbon atoms and more preferably a methyl group. The aryl group is preferably a phenyl group. $R_1$ to $R_6$ are each particularly preferably a methyl group.

It is preferable that at least one of $R_1$, ..., or $R_6$ has a substituent containing a radical polymerizable carbon-carbon double bond, and two of $R_1$ to $R_6$ are a substituent containing a radical polymerizable carbon-carbon double bond. Further, it is particularly preferable that among $R_1$ to $R_3$, the number of those having a substituent containing a radical polymerizable carbon-carbon double bond is 1, and among $R_4$ to $R_6$, the number of those having a substituent containing a radical polymerizable carbon-carbon double bond is 1.

In a case where the silane coupling agent represented by General Formula (1) has two or more substituents containing a radical polymerizable carbon-carbon double bond, the respective substituents may be the same or different, and are preferably the same.

It is preferable that the substituent containing a radical polymerizable carbon-carbon double bond is represented by —X—Y. Here, X is a single bond, an alkylene group having 1 to 6 carbon atoms, or an arylene group, preferably a single bond, a methylene group, an ethylene group, a propylene group, or a phenylene group; and Y is a radical polymerizable carbon-carbon double bond group, preferably an acryloyloxy group, a methacryloyloxy group, an acryloylamino group, a methacryloylamino group, a vinyl group, a propenyl group, a vinyloxy group, or a vinylsulfonyl group, and more preferably a (meth)acryloyloxy group.

$R_1$ to $R_6$ may also have a substituent other than the substituent containing a radical polymerizable carbon-carbon double bond. Examples of such a substituent include alkyl groups (for example, a methyl group, an ethyl group, an isopropyl group, a tert-butyl group, a n-octyl group, an n-decyl group, an n-hexadecyl group, a cyclopropyl group, a cyclopentyl group, and a cyclohexyl group), aryl groups (for example, a phenyl group and a naphthyl group), halogen atoms (for example, fluorine, chlorine, bromine, and iodine), acyl groups (for example, an acetyl group, a benzoyl group, a formyl group, and a pivaloyl group), acyloxy groups (for example, an acetoxy group, an acryloyloxy group, and a methacryloyloxy group), alkoxycarbonyl groups (for example, a methoxycarbonyl group and an ethoxycarbonyl group), aryloxycarbonyl groups (for example, a phenyloxycarbonyl group), and sulfonyl groups (for example, a methanesulfonyl group and a benzenesulfonyl group).

The silane coupling agent is contained in the coating liquid for forming a fluorescent material in the range of preferably 1% to 30% by mass, more preferably 3% to 30% by mass, and still more preferably 5% to 25% by mass, from the viewpoint of further improving the adhesion to the adjacent layer.

Surfactant

The coating liquid for forming a fluorescent material may contain at least one surfactant containing 20% by mass or more of fluorine atoms.

The surfactant preferably contains 25% by mass or more of fluorine atoms and more preferably 28% by mass or more of fluorine atoms. The upper limit value of the fluorine atom content is not specifically defined, but it is, for example, 80% by mass or less and preferably 70% by mass or less.

The surfactant used in the present invention is preferably a compound having an alkyl group having a fluorine atom, a cycloalkyl group having a fluorine atom, or an aryl group having a fluorine atom.

The alkyl group containing a fluorine atom is a linear or branched alkyl group in which at least one hydrogen atom is substituted with a fluorine atom. The alkyl group preferably has 1 to 10 carbon atoms and more preferably 1 to 4 carbon atoms. The alkyl group containing a fluorine atom may further have a substituent other than a fluorine atom.

The cycloalkyl group containing a fluorine atom is a monocyclic or polycyclic cycloalkyl group in which at least one hydrogen atom is substituted with a fluorine atom. The cycloalkyl group containing a fluorine atom may further have a substituent other than a fluorine atom.

The aryl group containing a fluorine atom is an aryl group in which at least one hydrogen atom is substituted with a fluorine atom. Examples of the aryl group include a phenyl group and a naphthyl group. The aryl group containing a fluorine atom may further have a substituent other than a fluorine atom.

By having such a structure, it is considered that the surface uneven distribution ability becomes satisfactory, and partial compatibility with the polymer occurs and phase separation is suppressed.

The molecular weight of the surfactant is preferably 300 to 10,000 and more preferably 500 to 5,000.

The content of the surfactant is, for example, 0.01% to 10% by mass, preferably 0.1% to 7% by mass, and more preferably 0.5% to 4% by mass in the total composition excluding the solvent. In a case where two or more surfactants are used, the total content thereof falls within the above range.

Examples of the surfactant include FLUORAD FC-430 and FC-43 (both manufactured by Sumitomo 3M Ltd.), SURFLON S-382 (manufactured by Asahi Glass Co., Ltd.), EFTOP "EF-122A, 122B, 122C, EF-121, EF-126, EF-127, and MF-100" (all manufactured by Tohkem Products Corporation), PF-636, PF-6320, PF-656 and PF-6520 (all manufactured by OMNOVA Solutions, Inc.), FTERGENT FT250, FT251 and DFX18 (all manufactured by NEOS Co., Ltd.), UNIDYNE DS-401, DS-403 and DS-451 (all manufactured by Daikin Industries Ltd.), MEGAFACE 171, 172, 173, 178K and 178A (all manufactured by DIC Corporation), X-70-090, X-70-091, X-70-092 and X-70-093 (all manufactured by Shin-Etsu Chemical Co., Ltd.), and MEGAFACE R-08 and XRB-4 (all manufactured by DIC Corporation).

Antioxidant

The curable compound preferably contains a known antioxidant. The antioxidant is for suppressing color fading due to heat and photo-irradiation, and for suppressing color fading by various oxidizing gases such as ozone, active oxygen $NO_x$, and $SO_x$ (X is an integer). Especially in the present invention, addition of the antioxidant brings about advantages that the coloring of the cured film can be prevented and film thickness reduction due to decomposition can be reduced.

In addition, two or more antioxidants may be used as the antioxidant.

The content of the antioxidant in the coating liquid for forming a fluorescent material is preferably 0.2% by mass or more, more preferably 1% by mass or more, and still more preferably 2% by mass or more with respect to the total mass of the coating liquid for forming a fluorescent material. On the other hand, the antioxidant may be altered due to the interaction with oxygen. The altered antioxidant may attract decomposition of the coating liquid for forming a fluorescent material, resulting in lowering of adhesion, brittleness deterioration, and lowering of quantum dot luminous efficiency. From the viewpoint of preventing these deteriorations, the content of the antioxidant is preferably 20% by mass or less, more preferably 15% by mass or less, and still more preferably 10% by mass or less.

The antioxidant is preferably one selected from a radical inhibitor, a metal deactivator, a singlet oxygen scavenger, a superoxide scavenger, and a hydroxy radical scavenger. Examples of the antioxidant include a phenol-based antioxidant, a hindered amine-based antioxidant, a quinone-based antioxidant, a phosphorus-based antioxidant, and a thiol-based antioxidant.

Examples of the phenol-based antioxidant include 2,6-di-tert-butyl-p-cresol, 2,6-diphenyl-4-octadecyloxyphenol, distearyl (3,5-di-tert-butyl-4-hydroxybenzyl)phosphonate, 1,6-hexamethylenebis[(3,5-di-tert-butyl-4-hydroxyphenyl) propionic acid amide], 4,4'-thiobis(6-tert-butyl-m-cresol), 2,2'-methylene-bis(4-methyl-6-tert-butylphenol), 2,2'-methylene-bis(4-ethyl-6-tert-butylphenol), 4,4'-butylidene-bis(6-tert-butyl-m-cresol), 2,2'-ethylidene-bis(4,6-di-tert-butylphenol), 2,2'-ethylidene-bis(4-sec-butyl-6-tert-butylphenol), 1,1,3-tris(2-methyl-4-hydroxy-5-tert-butylphenyl)butane, 1,3,5-tris(2,6-dimethyl-3-hydroxy-4-tert-butylbenzyl)isocyanurate, 1,3,5-tris(3,5-di-tert-butyl-4-hydroxybenzyl)isocyanurate, 1,3,5-tris(3,5-di-tert-butyl-4-hydroxybenzyl)-2,4,6-trimethylbenzene, 2-tert-butyl-4-methyl-6-(2-acryloyloxy-3-tert-butyl-5-methylbenzyl) phenol, stearyl(3,5-di-tert-butyl-4-hydroxyphenyl) propionate, tetrakis[3-(3,5-di-tert-butyl-4-hydroxyphenyl) propionic acid methyl]methane ((ADEKASTAB AO-60, manufactured by ADEKA Corporation)), thiodiethylene glycol bis[(3,5-di-tert-butyl-4-hydroxyphenyl)propionate], 1,6-hexamethylene bis[(3,5-di-tert-butyl-4-hydroxyphenyl)propionate], bis [3,3-bis(4-hydroxy-3-tert-butylphenyl)butyl acid]glycol ester, bis[2-tert-butyl-methyl-6-(2-hydroxy-3-tert-butyl-5-methylbenzyl)phenyl]terephthalate, 1,3,5-tris

[(3,5-di-tert-butyl-4-hydroxyphenyl)propionyloxyethyl]isocyanurate, 3,9-bis[1,1-dimethyl-2-{(3-tert-butyl-4-hydroxy-5-methylphenyl)propionyloxy}ethyl]-2,4,8,10-tetraoxaspiro[5,5]undecane, and triethylene glycol bis[(3-tert-butyl-4-hydroxy-5-methylphenyl)propionate].

Examples of the phosphorus-based antioxidant include trisnonylphenylphosphite, tris[2-tert-butyl-4(3-tert-butyl-4-hydroxy-5-methylphenylthio)-5-methylphenyl]phosphite, tridecyl phosphite, octyldiphenylphosphite, di(decyl)monophenyl phosphite, di(tridecyl)pentaerythritol diphosphite, di(nonylphenyl)pentaerythritol diphosphite, bis(2,4-di-tert-butylphenyl)pentaerythritol diphosphate, bis(2,6-di-tert-butyl-4-methylphenyl)pentaerythritol diphosphite, bis(2,4,6-tri-tert-butylphenyl)pentaerythritol diphosphite, bis(2,4-dicumylphenyl)pentaerythritol diphosphite, tetra(tridecyl) isopropylidenediphenoldiphosphite, tetra(tridecyl)-4,4'-n-butylidene bis(2-tert-butyl-5-methylphenol)diphosphite, hexa(tridecyl)-1,1,3-tris(2-methyl-4-hydroxy-5-tert-butylphenyl)butane triphosphite, tetrakis(2,4-di-tert-butylphenyl)biphenytene diphosphonite, 9,10-dihydro-9-oxa-10-phosphaphenanthrene-10-oxide, 2,2'-methylene-bis(4,6-tert-butylphenyl)-2-ethylhexyl phosphite, 2,2'-methylene-bis(4,6-tert-butylphenyl)-octadecyl phosphite, 2,2'-ethylidene-bis(4,6-di-tert-butylphenyl)fluorophosphite, tris(2-[(2,4,8,10-tetrakis-tert-butyldibenzo[d,f][1,3,2]dioxaphosphepin-6-yl)oxy]ethyl)amine, and phosphites of 2-ethyl-2-butylpropylene glycol and 2,4,6-tri-tert-butylphenol. The amount of these phosphorus-based antioxidants added is preferably 0.001 to 10 parts by mass and particularly preferably 0.05 to 5 parts by mass, with respect to 100 parts by mass of the polyolefin-based resin.

Examples of the thiol-based antioxidant include dialkylthiodipropionates such as dilaurylthiodipropionate, dimyristylthiodipropionate, and distearylthiodipropionate; and pentaerythritol tetra(β-alkyl mercaptopropionic acid) esters.

The hindered amine-based antioxidant is also referred to as a hindered amine light stabilizer (HALS), and has a structure in which all hydrogen atoms on carbons at 2- and 6-positions of piperidine are substituted with methyl groups, preferably a group represented by Formula 1. In Formula 1, X represents a hydrogen atom or an alkyl group. Among the groups represented by Formula 1, HALS having a 2,2,6,6-tetramethyl-4-piperidyl group in which X is a hydrogen atom, or a 1,2,2,6,6-pentamethyl-4-piperidyl group in which X is a methyl group is particularly preferably adopted. A large number of HALS having a structure in which a group represented by Formula 1 is bonded to a —COO— group, that is, a group represented by Formula 2 are commercially available, and these can be preferably used.

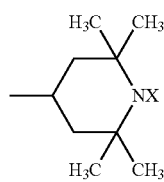

(Formula 1)

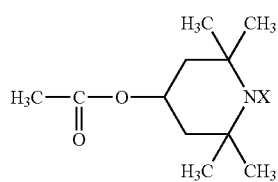

(Formula 2)

Specific examples of HALS that can be preferably used in the present invention include these represented by the following formulae. Here, the 2,2,6,6-tetramethyl-4-piperidyl group is represented by R and the 1,2,2,6,6-pentamethyl-4-piperidyl group is represented by R'.

ROC(=O)(CH$_2$)$_8$C(=O)OR, ROC(=O)C(CH$_3$)=CH$_2$, R'OC(=O)C(CH$_3$)=CH$_2$, CH$_2$(COOR)CH(COOR)CH(COOR)CH$_2$COOR, CH$_2$(COOR')CH(COOR')CH(COOR')CH$_2$COOR', a compound represented by Formula 3 below, and the like.

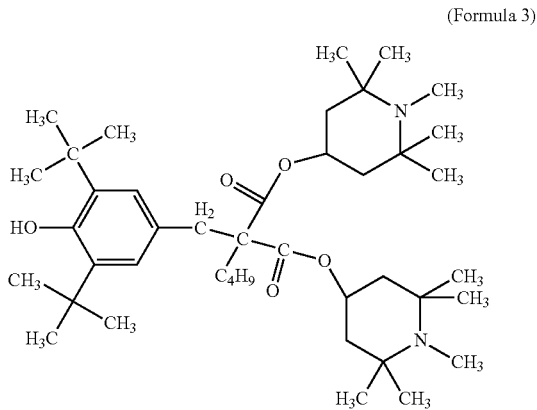

(Formula 3)

Specific examples of HALS include hindered amine compounds such as 2,2,6,6-tetramethyl-4-piperidylstearate, 1,2,2,6,6-pentamethyl-4-piperidylstearate, 2,2,6,6-tetramethyl-4-piperidylbenzoate, bis(2,2,6,6-tetramethyl-4-piperidyl)sebacate, bis(1,2,2,6,6-pentamethyl-4-piperidyl)sebacate, bis(1-octoxy-2,2,6,6-tetramethyl-4-piperidyl)sebacate, tetrakis(2,2,6,6-tetramethyl-4-piperidyl)-1,2,3,4-butane tetracarboxylate, tetrakis(1,2,2,6,6-pentamethyl-4-piperidyl)-1,2,3,4-butane tetracarboxylate, bis(2,2,6,6-tetramethyl-4-piperidyl)-di(tridecyl)-1,2,3,4-butane tetracarboxylate, bis(1,2,2,6,6-pentamethyl-4-piperidyl)-di(tridecyl)-1,2,3,4-butane tetracarboxylate, bis(1,2,2,4,4-pentamethyl-4-piperidyl)-2-butyl-2-(3,5-di-tert-butyl-4-hydroxybenzyl) malonate, 1-(2-hydroxyethyl)-2,2,6,6-tetramethyl-4-piperidinol/diethyl succinate polycondensate, 1,6-bis(2,2,6,6-tetramethyl-4-piperidylamino)hexane/2,4-dichloro-6-morpholino-s-triazine polycondensate, 1,6-bis(2,2,6,6-tetramethyl-4-piperidylamino)hexane/2,4-dichloro-6-tert-octylamiino-s-triazine polycondensate, 1,5,8,12-tetrakis[2,4-bis(N-butyl-N-(2,2,6,6-tetramethyl-4-piperidyl)amino)-s-triazin-6-yl]-1,5,8,12-tetraazadodecane, 1,5,8,12-tetrakis[2,4-bis(N-butyl-N-(1,2,2,6,6-pentamethyl-4-piperidyl)amino)-s-triazin-6-yl]-1,5,8-12-tetraazadodecane, 1,6,11-tris[2,4-bis(N-butyl-N-(2,2,6,6-tetramethyl-4-piperidyl)amino)-s-triazin-6-yl]aminoundecane, and 1,6,11-tris[2,4-bis(N-butyl-N-(1,2,2,6,6-pentamethyl-4-piperidyl)amino)-s-triazin-6-yl]aminoundecane.

Specific products of HALS include, but are not limited to, TINUVIN 123, TINUVIN 144, TINUVIN 765, TINUVIN 770, TINUVIN 622, CHIMASSORB 944, and CHIMASSORB 119 (all manufactured by Ciba Specialty Chemicals Inc.), ADEKASTAB LA52, ADEKASTAB LA57, ADEKASTAB LA62, ADEKASTAB LA67, ADEKASTAB LA82, ADEKASTAB LA87, and ADEKASTAB LX335 (all manufactured by Asahi Denka Kogyo KK).

Among the HALS, those having a relatively small molecular weight are preferable because of easy diffusion from the resin layer to the fluorescent material. Preferred HALS in this viewpoint are compounds represented by ROC(=O)(CH$_2$)$_8$C(=O)OR, R'OC(=O)C(CH$_3$)=CH$_2$, and the like.

Among the above-mentioned antioxidants, at least one of a hindered phenol compound, a hindered amine compound, a quinone compound, a hydroquinone compound, a tocopherol compound, an aspartic acid compound, or a thiol compound is more preferable, and at least one of a citric acid compound, an ascorbic acid compound, or a tocopherol compound is still more preferable. Although these compounds are not particularly limited, preferred examples thereof include hindered phenol, hindered amine, quinone, hydroquinone, tocopherol, aspartic acid, thiol, citric acid, tocopheryl acetate, and tocopheryl phosphate per se, and salts or ester compounds thereof.

An example of the antioxidant is shown below.

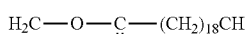
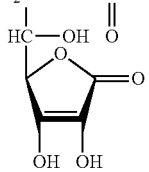

Ascorbic acid palmitic acid ester (ascorbyl palmitate)

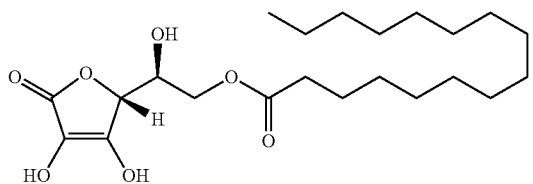

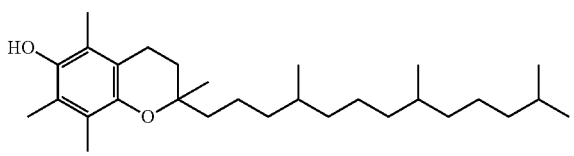

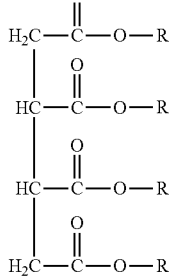

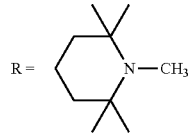

Tetrakis(1,2,2,6,6-pentamethyl-4-piperidyl)butane-1,2,3,4-tetracarboxylate (trade name: ADEKASTAB LA-52, manufactured by ADEKA Corporation)

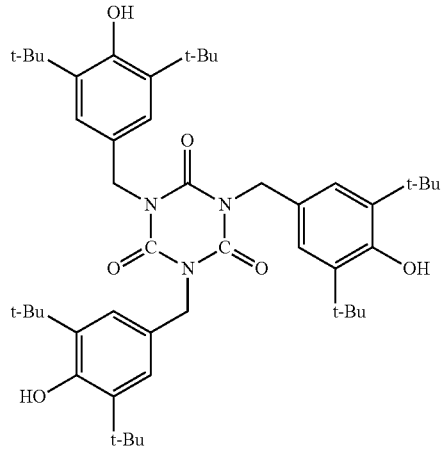 [SMILES: CC(C)(C)c1cc(Cn2c(=O)n(Cc3cc(C(C)(C)C)c(O)c(C(C)(C)C)c3)c(=O)n(Cc3cc(C(C)(C)C)c(O)c(C(C)(C)C)c3)c2=O)cc(C(C)(C)C)c1O]

1,3,5-tris(3,5-di-tert-butyl-4-hydroxybenzyl)-1,3,5-triazine-2,4,6(1H, 3H, 5H)-trione (trade name: ADEKASTAB AO-20, manufactured by ADEKA Corporation)

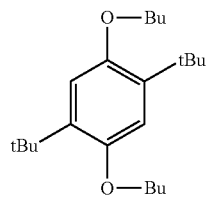

B-3

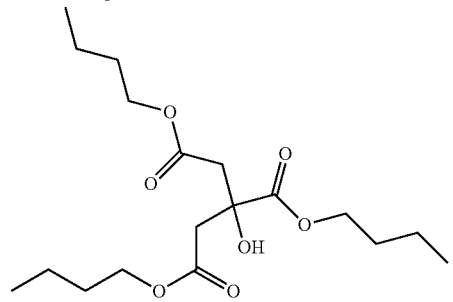

Tributyl citrate

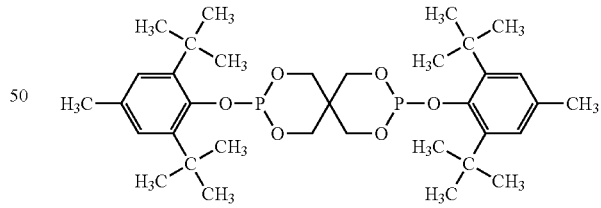

3,9-bis(2,6-di-tert-butyl-4-methylphenoxy)-2,4,8,10-tetraoxa-3,9-diphosphaspiro[5,5] undecane (trade name: ADEKASTAB PEP-36, manufactured by ADEKA Corporation)

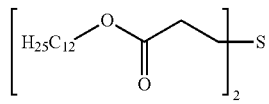

Dilaurylthiodipropinate (IRGANOX PS 800, 800FD, manufactured by BASF Corporation)

Oxygen Getter

A known substance used as a getter of an organic EL device can be used as the oxygen getter. The oxygen getter may be either an inorganic getter or an organic getter, and is preferable to include at least one compound selected from a metal oxide, a metal halide, a metal sulfate, a metal perchlorate, a metal carbonate, a metal alkoxide, a metal carboxylate, a metal chelate, or a zeolite (aluminosilicate).

Examples of such an oxygen getter include calcium oxide (CaO), barium oxide (BaO), magnesium oxide (MgO), strontium oxide (SrO), lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$).

The organic getter is not particularly limited as long as it is a material that takes in water by a chemical reaction and does not become opaque before and after the reaction. Here, the organometallic compound means a compound having a metal-carbon bond, a metal-oxygen bond, a metal-nitrogen bond or the like. In a case where water reacts with the organometallic compound, the above-mentioned bond of the compound breaks due to a hydrolysis reaction to result in a metal hydroxide. Depending on the metal, hydrolytic polycondensation may be carried out to increase the molecular weight after the reaction into the metal hydroxide.

As the metal of the metal alkoxide, the metal carboxylate, and the metal chelate, it is preferable to use a metal having good reactivity with water as the organometallic compound, that is, a metal atom which is easily breakable from a variety of bonds by the action of water. Specific examples thereof include aluminum, silicon, titanium, zirconium, bismuth, strontium, calcium, copper, sodium, and lithium. In addition, cesium, magnesium, barium, vanadium, niobium, chromium, tantalum, tungsten, chromium, indium, iron, and the like can be mentioned. In particular, a desiccating agent of an organometallic compound having aluminum as a central metal is preferable in terms of dispersibility in a resin and reactivity with water. Examples of the organic group include an unsaturated hydrocarbon such as a methoxy group, an ethoxy group, a propoxy group, a butoxy group, a 2 ethylhexyl group, an octyl group, a decyl group, a hexyl group, an octadecyl group, a stearyl group, a saturated hydrocarbon, a branched unsaturated hydrocarbon, a branched saturated hydrocarbon, an alkoxy group or carboxyl group containing a cyclic hydrocarbon, an acetylacetonato group, and a β-diketonato group such as a dipivaloylmethanato group.

Among them, aluminum ethyl acetoacetates having 1 to 8 carbon atoms shown in the following chemical formulae are suitably used from the viewpoint that the fluorescent material 20 having excellent transparency can be formed.

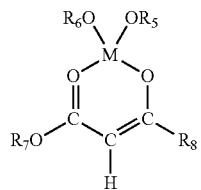

(in the formula, $R_5$ to $R_8$ each represent an organic group including an alkyl group, an aryl group, an alkoxy group, a cycloalkyl group or an acyl group, each of which has 1 to 8 carbon atoms, and M represents a trivalent metal atom. In addition, $R_5$ to $R_8$ may be the same organic group or different organic group.)

The above-mentioned aluminum ethyl acetoacetates having 1 to 8 carbon atoms are commercially available, for example, from Kawaken Fine Chemical Co., Ltd. or Hope Pharmaceutical Co., Ltd.

The oxygen getter is in particulate or powder form. The average particle diameter of the oxygen getter may be usually in the range of less than 20 μm, preferably 10 μm or less, more preferably 2 μm or less, and still more preferably 1 μm or less. From the viewpoint of scattering property, the average particle diameter of the oxygen getter is preferably 0.3 to 2 μm and more preferably 0.5 to 1.0 μm. The term "average particle diameter" as used herein refers to an average value of particle diameters calculated from a particle size distribution measured by a dynamic light scattering method.

Polymerization Inhibitor

The coating liquid for forming a fluorescent material may contain a polymerization inhibitor. The content of the polymerization inhibitor is 0.001% to 1% by mass, more preferably 0.005% to 0.5% by mass, and still more preferably 0.008% to 0.05% by mass, with respect to all the polymerizable monomers, and changes in viscosity over time can be suppressed while maintaining a high curing sensitivity by blending the polymerization inhibitor in an appropriate amount. On the other hand, in a case where the amount of the polymerization inhibitor to be added is excessive, a curing failure due to inhibition of polymerization and coloration of the cured product occur, so an appropriate amount of the polymerization is present. The polymerization inhibitor may be added at the time of production of the polymerizable monomer or may be added later to the curable composition. Preferred examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylene-bis(4-methyl-6-tert-butylphenol), cerous N-nitrosophenylhydroxyamine, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline, among which preferred is p-benzoquinone, 2,2,6,6-tetramethylpiperidine-1-oxyl free radical, 4-hydroxy-2,2,6,6-tetramethylpiperidine-1-oxyl free radical, or phenothiazine. These polymerization inhibitors suppress generation of polymer impurities not only during the production of the polymerizable monomers but also during storage of the curable composition and suppress degradation of pattern formability during imprinting.

Inorganic Particles

Further, the coating liquid for forming a fluorescent material preferably contains inorganic particles. That is, the fluorescent material 20 preferably contains inorganic particles.

Incorporation of inorganic particles can provide an enhanced impermeability to oxygen. Examples of inorganic particles include inorganic layered compounds such as silica particles, alumina particles, zirconium oxide particles, zinc oxide particles, titanium oxide particles, mica, and talc. The inorganic particles are preferably plate-like from the viewpoint of enhancing the impermeability to oxygen, and the aspect ratio (r=a/b, where a>b) of the inorganic particles is preferably 2 to 1000, more preferably 10 to 800, and still more preferably 20 to 500. A larger aspect ratio is preferable because it has an excellent effect of enhancing the impermeability to oxygen. However, in a case where the aspect ratio is too large, physical strength of a film and particle dispersibility in a curing composition are poor.

Light Scattering Particles

The phosphor-containing layer 16 (the fluorescent material 20 and/or the resin layer 18) may contain light scattering particles. Therefore, the coating liquid for forming a fluorescent material may contain light scattering particles.

The particle size of the light scattering particles is preferably 0.10 μm or more. Incorporation of the light scattering particles in the phosphor-containing layer 16 is preferable from the viewpoint of further improving the luminance. From the viewpoint of the light scattering effect, the particle size of the light scattering particles is preferably 0.10 to 15.0 μm, more preferably 0.10 to 10.0 μm, and still more preferably 0.20 to 4.0 μm. Two or more kinds of light scattering particles having different particle sizes may be mixed and used in order to further improve the luminance and adjust the distribution of the luminance with respect to the viewing angle.

The light scattering particles may be organic particles, inorganic particles, or organic-inorganic composite particles. For example, synthetic resin particles can be mentioned as organic particles. Specific examples of synthetic resin particles include silicone resin particles, acrylic resin particles (polymethyl methacrylate (PMMA)), nylon resin particles, styrene resin particles, polyethylene particles, urethane resin particles, and benzoguanamine particles. From the viewpoint of the light scattering effect, it is preferable that the refractive indices of the light scattering particles and the other portion are different in the phosphor-containing layer, and from this point of view, the silicone resin particles and acrylic resin particles are preferable from the viewpoint of easy availability of particles having a suitable refractive index. Particles having a hollow structure can also be used. As the inorganic particles, particles of diamond, titanium oxide, zirconium oxide, lead oxide, lead carbonate, zinc oxide, zinc sulfide, antimony oxide, silicon oxide, aluminum oxide (alumina), and the like can be used. Titanium oxide and aluminum oxide are preferable from the viewpoint of easy availability of particles having a suitable refractive index.

In addition to the above-mentioned components, a releasing agent, a silane coupling agent, an ultraviolet absorber, a light stabilizer, an anti-aging agent, a plasticizer, an adhesion promoter, a thermal polymerization initiator, a colorant, elastomer particles, a photoacid proliferating agent, a photobase generator, a basic compound, a flow adjusting agent, an anti-foaming agent, a dispersant, or the like may be optionally added to the coating liquid for forming a fluorescent material.

The method for preparing the curable composition forming a binder is not particularly limited, and it may be carried out by a procedure for preparing a common curable composition.

Resin Layer

The resin layer 18 is formed by preparing, applying and curing a coating liquid for forming a resin layer containing the same curable composition as the above-mentioned curable composition forming the binder 26. In addition, the curable composition forming a resin layer may not contain a polymer dispersant.

The resin layer 18 preferably has impermeability to oxygen. That is, the resin layer 18 satisfies an oxygen permeability of 10 cc/m$^2$·day·atm or less at the shortest distance between the adjacent fluorescent materials 20 with the wall portion forming the concave portion 18a interposed therebetween. The oxygen permeability of the resin layer 18 at the shortest distance between adjacent fluorescent materials 20 is preferably 1 cc/m$^2$·day·atm or less and more preferably 1×10$^{-1}$ cc/m$^2$·day·atm or less.

Depending on the composition of the resin layer 18, the shortest distance necessary between the fluorescent materials 20, that is, the required spacing t between the fluorescent materials 20 (concave portions 18a) varies. The shortest distance between the adjacent fluorescent materials 20 of the resin layer 18 refers to the shortest distance in the film plane between the adjacent fluorescent materials 20 in a case where it is observed from the phosphor-containing film main surface.

The resin layer 18 has a modulus of elasticity of preferably 0.5 to 10 GPa, more preferably 1 to 7 GPa, and still more preferably 3 to 6 GPa. By setting the modulus of elasticity of the resin layer within this range, it is possible to prevent defects during the formation of the resin layer while maintaining oxygen permeability, which is thus preferable.

The modulus of elasticity of the resin layer is measured by a method exemplified in Japanese Industrial Standards (JIS) K7161 or the like.

In the coating liquid for forming a resin layer (curable composition), a compound having a di- or higher functional photopolymerizable crosslinking group is preferable as the material for forming the resin layer 18. Examples of the compound having a di- or higher functional photopolymerizable crosslinking group include alicyclic (meth)acrylate such as urethane (meth)acrylate or tricyclodecanedimethanol di(meth)acrylate; (meth)acrylate having a hydroxyl group such as pentaerythritol triacrylate; aromatic (meth)acrylate such as modified bisphenol A di(meth)acrylate; dipentaerythritol di(meth)acrylate, 3,4-epoxycyclohexylmethyl (meth)acrylate, 3',4'-epoxycyclohexylmethyl 3,4-epoxycyclohexane carboxylate, and bisphenol A type epoxy. Above all, it is preferable to include at least urethane (meth)acrylate and an epoxy compound from the viewpoint of enhancing the impermeability to oxygen. By using a compound having a urethane bond and a compound having a polar functional group such as a hydroxyl group and/or a carboxyl group to enhance intermolecular interaction, a resin layer having high impermeability to oxygen can be obtained.

The coating liquid for forming a resin layer preferably contains a compound having the same polymerizable crosslinking group as that of the coating liquid for forming a fluorescent material, from the viewpoint of obtaining excellent adhesion between the resin layer 18 and the fluorescent material 20. For example, in a case where the coating liquid for forming a fluorescent material contains dicyclopentanyl (meth)acrylate or the like, the coating liquid for forming a resin layer preferably contains at least a (meth)acrylate compound.

Additives

The coating liquid for forming a resin layer may optionally contain a photopolymerization initiator, an inorganic layered compound, light scattering particles, an antioxidant, a peeling accelerator, a solvent, and the like.

Photopolymerization Initiator

The coating liquid for forming a resin layer preferably contains a photopolymerization initiator. Any photopolymerization initiator may be used as long as it is a compound capable of generating an active species that polymerizes the polymerizable compound upon irradiation of light. Examples of the photopolymerization initiator include a cationic polymerization initiator and a radical polymerization initiator, which are appropriately selected according to the material for forming a resin layer.

Inorganic Layered Compound

The coating liquid for forming a resin layer may contain a compound that imparts a so-called maze effect, such as an inorganic layered compound, which extends the diffusion length of gas molecules in the resin layer to improve gas barrier properties.

Examples of such an inorganic layered compound include talc, mica, feldspar, kaolinite (kaolin clay), pyrophyllite (pyrophyllite clay), sericite (silk mica), bentonite, smectite-vermiculites (montmorillonite, beidellite, non-tronite, saponite, and the like), organic bentonite, organic smectite, and flat inorganic oxide such as flat alumina. These layered compounds can be used alone or in combination of two or more thereof.

The inorganic layered compound may be subjected to a surface treatment in order to improve dispersibility in the coating liquid for forming a resin layer. Further, from the viewpoint of the excellent maze effect described above, the inorganic layered compound preferably has an aspect ratio of 10 to 1000. In a case where the aspect ratio is 10 or less, the effect of improving the gas barrier properties due to the maze effect is low, and in a case where the aspect ratio is 1000 or more, the inorganic layered compound is brittle and therefore may be crushed during the production process.

Commercially available inorganic layered compounds are also available. Examples of commercially available inorganic layered compounds include ST-501 and ST-509 (manufactured by Shiraishi Calcium Kaisha, Ltd.), SOMASIF series and Micro Mica series (manufactured by Katakura &Co-op Agri Corporation), and SERAPH series (manufactured by Kinsei Matec Co., Ltd.). In particular, in the phosphor-containing film 10 according to the embodiment of the present invention, a SERAPH series having high transparency can be suitably used.

As the light scattering particles, the antioxidant, and the like, the same ones as the above-mentioned coating liquid for forming a fluorescent material can be used.

Substrate Film

As described above, the first substrate film 12 (the second substrate film 14) has a configuration in which the barrier layer 12b is laminated on the support film 12a. In addition, the barrier layer 12b (the barrier layer 14b) has an underlying organic layer 34, an inorganic layer 36, and a protective organic layer 38.

Such a first substrate film 12 is laminated on the phosphor-containing layer 16 with the barrier layer 12b facing the phosphor-containing layer 16.

In this configuration, the strength of the phosphor-containing film 10 is improved by the support film 12a, and film formation can be easily carried out.

In the present invention, the first substrate film (the second substrate film) is not limited to such a configuration having the support film 12a and the barrier layer 12b. Various film-like materials (sheet-like materials) can be used as long as they can ensure the required oxygen impermeability.

For example, the first substrate film may be constituted only of a support film having sufficient barrier properties. In addition, a first substrate film in which only one inorganic layer is formed on the surface of the support film can also be used.

The first substrate film 12 has a total light transmittance in the visible light region of preferably 80% or more and more preferably 85% or more. The visible light region refers to a wavelength range of 380 to 780 nm, and the total light transmittance refers to an average value of light transmittances over the visible light region.

The oxygen permeability of the first substrate film 12 preferably has an oxygen permeability of 1 cc/m$^2 \cdot$day$\cdot$atm or less.

The oxygen permeability of the first substrate film 12 is more preferably 0.1 cc/m$^2 \cdot$day$\cdot$atm or less, still more preferably 0.01 cc/m$^2 \cdot$day$\cdot$atm or less, and particularly preferably 0.001 cc/m$^2 \cdot$day$\cdot$atm or less.

The first substrate film 12 preferably has a water vapor barrier function of blocking moisture (water vapor), in addition to a gas barrier function of blocking oxygen. The moisture permeability (water vapor permeability) of the first substrate film 12 is preferably 0.10 g/m$^2 \cdot$day$\cdot$atm or less and more preferably 0.01 g/m$^2 \cdot$day$\cdot$atm or less.

Support Film

The support film 12a (the support film 14a) is preferably a flexible belt-like support film which is transparent to visible light. The phrase "transparent to visible light" as used herein refers to a light transmittance in the visible light region of 80% or more and preferably 85% or more. The light transmittance for use as a measure of transparency can be calculated by the method described in JIS K7105, namely, by measuring a total light transmittance and an amount of scattered light using an integrating sphere type light transmittance measuring apparatus, and subtracting the diffuse transmittance from the total light transmittance. With respect to the flexible support film, reference can be made to paragraphs [0046] to [0052] of JP2007-290369A and paragraphs [0040] to [0055] of JP2005-096108A.

Preferred examples of the support film 12a include a polyethylene terephthalate film (PET), a film made of a polymer having a cyclic olefin structure, and a polystyrene film.

The average film thickness of the support film 12a is preferably 10 to 500 μm, more preferably 20 to 400 μm, and still more preferably 30 to 300 μm from the viewpoint of impact resistance of the phosphor-containing film or the like.

Since it is preferable that the absorbance of light having a wavelength of 450 nm is lower in an aspect of increasing the retroreflection of light as in a case where the concentration of the quantum dots contained in the phosphor-containing layer 16 is reduced and in a case where the thickness of the phosphor-containing layer 16 is reduced, the average film thickness of the support film 12a is preferably 40 μm or less and more preferably 25 μm or less from the viewpoint of suppressing reduction in luminance.

Further, in the support films 12a, the in-plane retardation Re (589) at a wavelength of 589 nm is preferably 1000 nm or less, more preferably 500 nm or less, and still more preferably 200 nm or less.

In a case of inspecting the presence or absence of foreign matters and defects after producing the phosphor-containing film, arranging two polarizing plates at the extinction position, inserting a phosphor-containing film therebetween and observing it makes it easy to find foreign matters and defects. In a case where the Re (589) of the support film is within the above range, foreign matters and defects are more easily found at the time of inspection using a polarizing plate, which is thus preferable.

Here, the Re (589) can be measured by making light having an input wavelength of 589 nm incident in the normal direction of the film using an AxoScan OPMF-1 (manufactured by Opto Science, Inc.).

Barrier Layer

The first substrate film 12 (the second substrate film 14) has the barrier layer 12b on one surface of the support film 12a.

As described above, various known barrier layers can be used for the barrier layer 12b, but a barrier layer having at least one inorganic layer is preferable, and an organic-inorganic laminated barrier layer having one or more combinations of an inorganic layer and an organic layer to be an underlying layer of the inorganic layer is more preferable.

In the phosphor-containing film 10 of the illustrated example, as shown in the partially enlarged view A of FIG. 3, the barrier layer 12b of the first substrate film has a configuration in which three layers of an underlying organic layer 34 formed on the surface of the support film 12a, an inorganic layer 36 formed on the underlying organic layer 34, and a protective organic layer 38 formed on the inorganic layer 36 are laminated. In the following description, in a case where it is not necessary to distinguish between the underlying organic layer 34 and the protective organic layer 38, both are collectively referred to as an "organic layer".

Inorganic Layer

The inorganic layer 36 is a layer containing an inorganic material as a main component, is preferably a layer in which the inorganic material occupies 50% by mass or more, further 80% by mass or more, particularly 90% by mass or more, and is preferably a layer formed from only an inorganic material.

The inorganic layer 36 is preferably a layer having a gas barrier function of blocking oxygen. Specifically, the oxygen permeability of the inorganic layer is preferably 1 cc/m$^2$·day·atm or less. The oxygen permeability of the inorganic layer can be determined by attaching a wavelength converting layer to a detector of an oxygen concentration meter manufactured by Orbisphere Laboratories, via silicone grease, and then converting the oxygen permeability from the equilibrium oxygen concentration value. It is also preferable that the inorganic layer has a function of blocking water vapor.

The thickness of the inorganic layer 36 is preferably 1 to 500 nm, more preferably 5 to 300 nm, and still more preferably 10 to 150 nm. This is because the film thickness of the inorganic layer 36 in the above range is capable of suppressing reflection on the inorganic layer 36 while achieving satisfactory barrier properties, whereby a laminated film with higher light transmittance can be provided.

The inorganic material constituting the inorganic layer 36 is not particularly limited, and for example, a metal, or various inorganic compounds such as inorganic oxides, nitrides or oxynitrides can be used therefor. For element(s) constituting the inorganic material, silicon, aluminum, magnesium, titanium, tin, indium, and cerium are preferable, and these elements may be included singly or two or more thereof may be included. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, a metal film may be provided as the inorganic layer. Examples of the metal film include an aluminum film, a silver film, a tin film, a chromium film, a nickel film, and a titanium film.

Among the above-mentioned materials, the inorganic layer 36 containing at least one compound selected from silicon nitride, silicon oxynitride, silicon oxide, or aluminum oxide is preferable in terms of barrier properties and transparency. This is because the inorganic layer 36 formed of such a material is satisfactory in adhesion to the organic layer, and therefore, not only, even in a case where the inorganic layer 36 has a pinhole, the organic layer can effectively fill in the pinhole to suppress fracture, but also, even in a case where the inorganic layer 36 is laminated, an extremely satisfactory inorganic layer 36 can be formed to result in a further enhancement in barrier properties. In addition, from the viewpoint of suppressing absorption of light in the barrier layer 12b, silicon nitride is most preferable.

The method of forming the inorganic layer 36 is not particularly limited. For example, various film forming methods can be used in which the film forming material can be evaporated or scattered to be deposited on the deposition surface.

Examples of the method of forming an inorganic layer include physical vapor deposition (PVD) methods such as a vacuum vapor deposition method of heating an inorganic material such as an inorganic oxide, an inorganic nitride, an inorganic oxynitride, or a metal to cause vapor deposition thereof; an oxidation reaction vapor deposition method of using an inorganic material as a starting material and introducing oxygen gas for oxidation to cause vapor deposition thereof; a sputtering method of using an inorganic material as a target starting material and introducing argon gas or oxygen gas for sputtering to cause vapor deposition; and an ion plating method of causing heating of an inorganic material by a plasma beam generated by a plasma gun to cause vapor deposition. In addition, a plasma chemical vapor deposition (CVD) method using an organosilicon compound as a starting material can also be employed in a case of forming a vapor deposited film of silicon oxide.

Organic Layer

The organic layer (underlying organic layer 34 and protective organic layer 38) refers to a layer containing an organic material as a main component, in which the organic material preferably occupies 50% by mass or more, further preferably 80% by mass or more, and particularly preferably 90% by mass or more.

With respect to the organic layer, reference can be made to paragraphs [0020] to [0042] of JP2007-290369A and paragraphs [0074] to [0105] of JP2005-096108A. It is preferable that the organic layer contains a cardo polymer within a range satisfying the above-mentioned adhesion conditions. This is because adhesion to the layer adjacent to the organic layer, in particular, also adhesion to the inorganic layer can be thus improved to achieve excellent gas barrier properties. With respect to details of the cardo polymer, reference can be made to paragraphs [0085] to [0095] of JP2005-096108A described above.

The film thickness of the organic layer is preferably 0.05 to 10 µm and more preferably 0.5 to 10 µm. In a case where the organic layer is formed by a wet coating method, the film thickness of the organic layer is preferably 0.5 to 10 µm and more preferably 1 to 5 µm. In a case where the organic layer is formed by a dry coating method, the film thickness of the organic layer is preferably 0.05 to 5 µm and more preferably 0.05 to 1 µm. In a case where the film thickness of the organic layer formed by a wet coating method or a dry coating method is within the above range, the adhesion to the inorganic layer can be made better.

With respect to other details of the inorganic layer and the organic layer, reference can be made to the descriptions of JP2007-290369A and JP2005-096108A described above and US2012/0113672A1.

In the phosphor-containing film, the organic layer may be laminated as the underlying layer of the inorganic layer between the support film and the inorganic layer, and may be laminated as the protective layer of the inorganic layer between the inorganic layer and the phosphor-containing layer. Further, in a case of having two or more inorganic layers, the organic layer may be laminated between the inorganic layers.

Concavity-Convexity Imparting Layer

The first substrate film 12 (the second substrate film 14) may be provided with a concavity-convexity imparting layer for imparting a concave-convex structure on the surface opposite to the surface on the phosphor-containing layer 16 side. In a case where the first substrate films 12 has a concavity-convexity imparting layer, the blocking property and sliding property of the substrate film can be improved, which is thus preferable. The concavity-convexity imparting layer is preferably a layer containing particles. Examples of the particles include inorganic particles such as silica, alumina, or metal oxide, and organic particles such as cross-linked polymer particles. The concavity-convexity imparting layer is preferably provided on the surface opposite to the phosphor-containing layer of the substrate film, but it may be provided on both surfaces.

The phosphor-containing film 10 according to the embodiment of the present invention can have a light scattering function to efficiently extract the fluorescence of quantum dots to the outside.

The light scattering function may be provided inside the phosphor-containing layer 16 or a layer having a light scattering function may be separately provided as the light scattering layer. The light scattering layer may be provided on the surface on the side of the phosphor-containing layer 16 of the first substrate film 12 and/or the second substrate film 14 or may be provided on the surface on the side opposite to the phosphor-containing layer 16 of the first substrate film 12 and/or the second substrate film 14. In a case where the concavity-convexity imparting layer is provided, it is preferable that the concavity-convexity imparting layer is a layer which can also serve as the light scattering layer.

Mixed Layer and Impermeable Layer

As described above, the mixed layer 18 is a fluorescent material containing an oxygen-impermeable material in addition to the phosphor 24 and the binder 26 contained in the fluorescent material 20. In addition, the impermeable layer 30 is a layer that does not contain the phosphor 24 and the binder 26 and is made of an oxygen-impermeable material.

Various materials exemplified as a material for forming the resin layer 18 are exemplified as the oxygen-impermeable material. Above all, the mixed layer 28 and the impermeable layer 30 preferably contain a material containing the same component as the material for forming the resin layer 18 as the oxygen-impermeable material. In a case where the material for forming the resin layer 18 contains an inorganic layered compound, a material containing the same component as the material for forming the resin layer 18 is preferably used as the oxygen-impermeable material except that it does not contain the inorganic layered compound.

Production Method of Phosphor-Containing Film

Next, an example of production steps of the phosphor-containing film according to the embodiment of the present invention configured as described above will be described with reference to conceptual diagrams of FIGS. 11 and 12.

First, in addition to the curable compound to be the resin layer 18, if necessary, individual components such as a polymerization initiator, inorganic particles such as flat alumina, and light scattering particles are added to prepare a composition which is then mixed to prepare a coating liquid L1 for a resin layer.

In addition, a coating liquid for forming a fluorescent material is prepared, which contains quantum dots (or quantum rods) as the phosphors 24. Specifically, in addition to the quantum dots and the curable compound to be the binder 26, if necessary, individual components such as an organic solvent, a polymer dispersant, a polymerization initiator, a silane coupling agent, and light scattering particles are added to prepare a composition which is then mixed to prepare a coating liquid L2 for forming a fluorescent material.

In addition, a mold M having a concavo-convex pattern according to the concave portion 18a and the wall portion of the resin layer 18, which is for forming the resin layer 18, and the first substrate film 12 and the second substrate film 14 are prepared.

Figure 11:
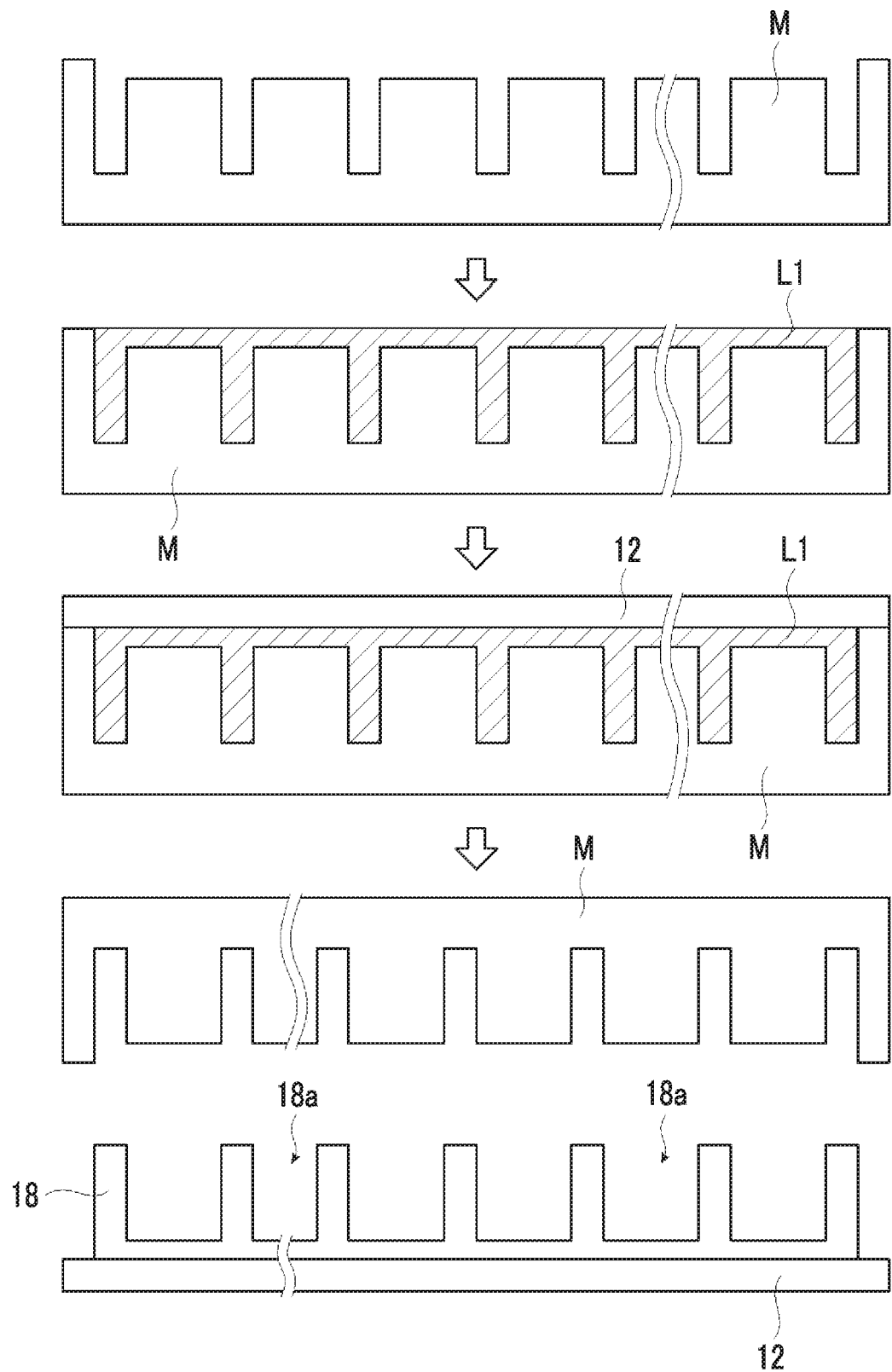
FIG. 11 is a conceptual diagram for explaining an example of a method for producing an example of the phosphor-containing film of the present invention.

After preparing these, first, as shown in the first and second stages of FIG. 11, the prepared mold M is filled with the prepared coating liquid L1 for forming a resin layer, and as shown in the third stage of FIG. 11, the first substrate film 12 is laminated on the mold M so as to cover the entire surface of the coating liquid L1 for forming a resin layer.

Next, the coating liquid L1 for forming a resin layer is cured by, for example, ultraviolet irradiation to form the resin layer 18, and as shown in the fourth stage of FIG. 11, the mold M is removed from the resin layer 18. Thus, a laminate is formed in which the resin layer 18 with the bottom of the concave portion 18a facing the first substrate film 12 is laminated on one surface of the first substrate film 12.

Figure 12:
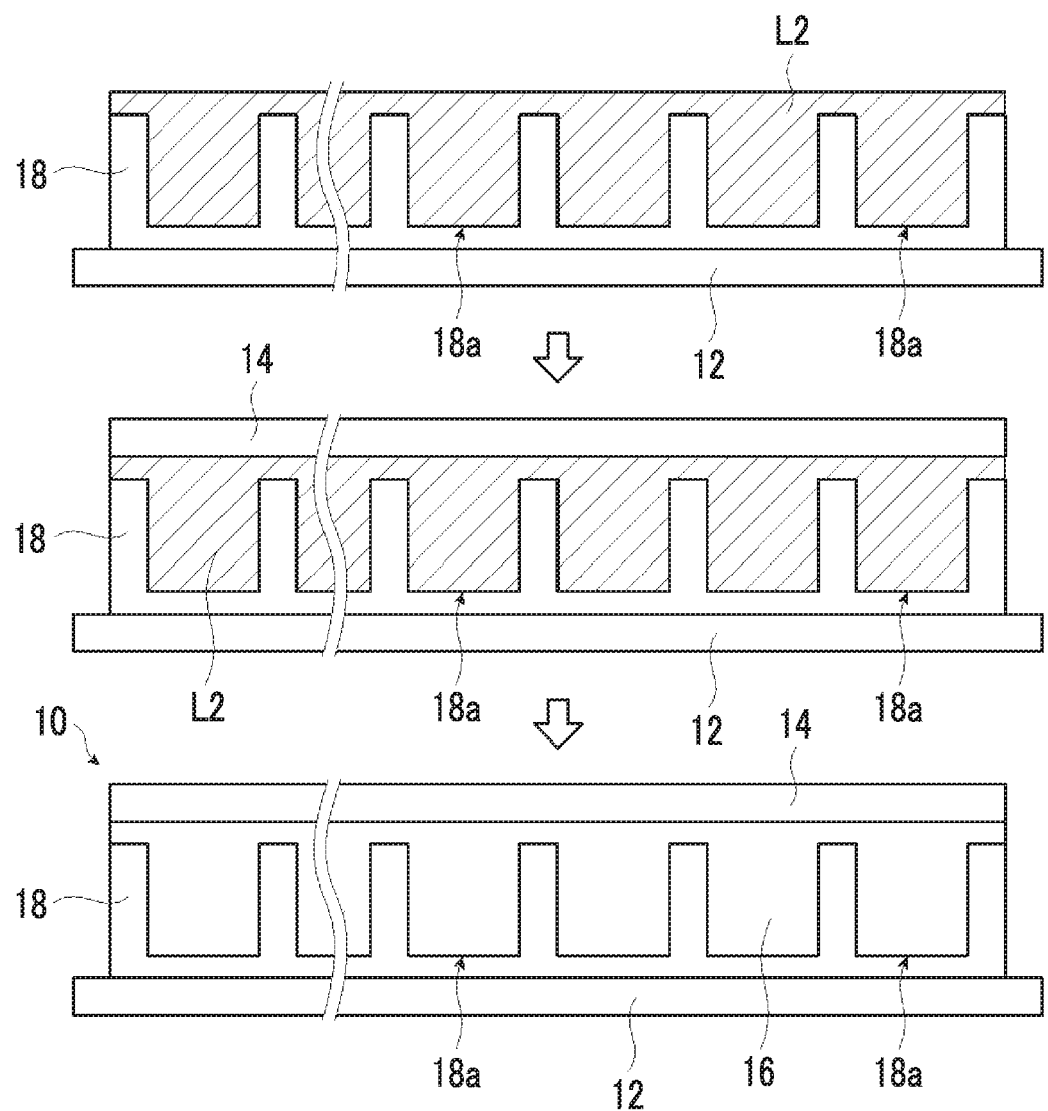
FIG. 12 is a conceptual diagram for explaining an example of a method for producing an example of the phosphor-containing film of the present invention.

After the laminate of the first substrate film 12 and the resin layer 18 is formed, as shown in the first stage of FIG. 12, the concave portion 18a is filled with the prepared coating liquid L2 for forming a fluorescent material. In this case, the concave portion 18a is filled with the coating liquid L2 for forming a fluorescent material such that the coating liquid L2 for forming a fluorescent material is raised above the upper end of the wall portion of the resin layer 18 by using the surface tension and the viscosity of the coating liquid L2 for forming a fluorescent material.

Next, as shown in the second stage of FIG. 12, the second substrate film 14 is laminated so as to cover and seal the entire surface of the coating liquid L2 for forming a fluorescent material. As will be described later in the Examples, the gap between the upper end of the wall portion of the resin layer 18 and the second substrate film 14 can be adjusted by adjusting the pressing force of the second substrate film 14 at this time. For example, in a case of laminating the second substrate film 14 with a laminator, the gap between the upper end of the wall portion of the resin layer 18 and the second substrate film 14 can be adjusted by adjusting the pressure of the laminator.

Finally, for example, the coating liquid L2 for forming a fluorescent material is cured by light irradiation to form the fluorescent material 20, and, as shown in the third stage of FIG. 12, the phosphor-containing film 10 is produced in which the phosphor-containing layer 16 having the fluorescent material 20 and the resin layer 18 is sandwiched between the first substrate film 12 and the second substrate film 14.

Figure 13:
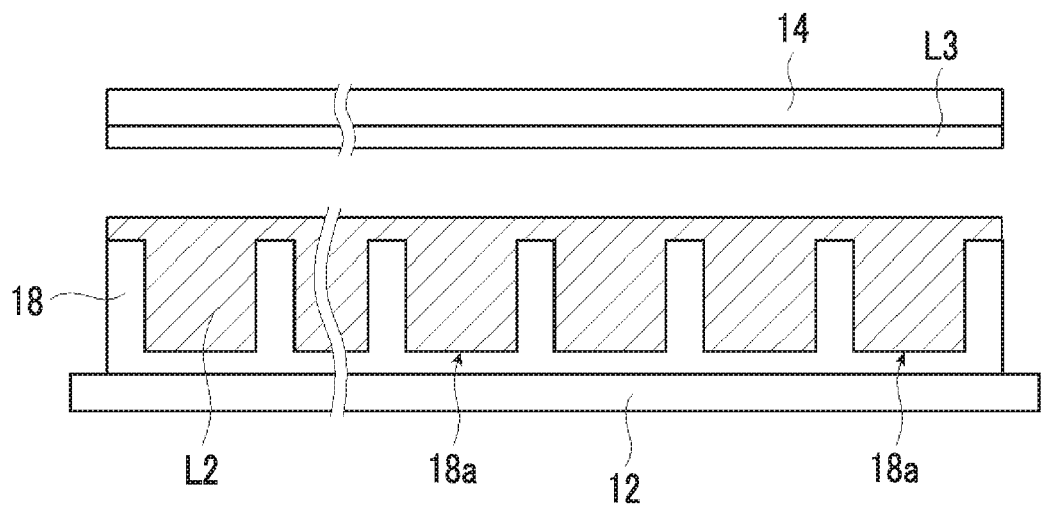
FIG. 13 is a conceptual diagram for explaining an example of a method for producing another example of the phosphor-containing film of the present invention.

In a case where the mixed layer 28 or the impermeable layer 30 is formed as in the phosphor-containing film 10A shown in FIG. 6 and the phosphor-containing film 10B shown in FIG. 7, a coating liquid L3 containing an oxygen-impermeable material is applied to one surface of the second substrate film 14, as schematically shown in FIG. 13, prior to the lamination of the second substrate film 14, which is shown in the second stage of FIG. 12.

Thereafter, as shown in the second stage of FIG. 12, the second substrate film 14 is laminated with the coating surface of the coating liquid L3 facing the coating liquid L2 for forming a fluorescent material so as to cover and seal the entire surface of the coating liquid L2 for forming a fluorescent material. Thereby, the coating liquid L2 for forming a fluorescent material and the coating liquid L3 containing an oxygen-impermeable material are mixed.

Thereafter, the coating liquid L2 for forming a fluorescent material and the coating liquid L3 containing an oxygen-impermeable material can be cured to produce a phosphor-containing film having the mixed layer 28 or further the impermeable layer 30 together with the fluorescent material 20.

In this case, as described above, it can be set whether to form only the mixed layer 28 or to form both the mixed layer 28 and the impermeable layer 30 by adjusting the coating thickness of the coating liquid L3 containing an oxygen-impermeable material to the second substrate film 14.

Specifically, in a case where the coating thickness of the coating liquid L3 containing an oxygen-impermeable material to the second substrate film 14 is thin, only the mixed layer 28 can be formed; and in a case where the coating thickness of the coating liquid L3 containing an oxygen-impermeable material to the second substrate film 14 is increased, both the mixed layer 28 and the impermeable layer 30 can be formed. In addition, the impermeable layer 30 becomes thicker as the coating thickness of the coating liquid L3 increases.

Further, as described above, various materials exemplified for the material for forming the resin layer 18 can be used as the oxygen-impermeable material. Preferably, the coating liquid L3 containing an oxygen-impermeable material is the same coating liquid as the coating liquid L1 for forming a resin layer having the resin layer 18 formed.

However, it is preferable that the mixed layer 28 and the impermeable layer 30 do not contain an inorganic plate-like compound. Therefore, it is preferable that the coating liquid L3 containing an oxygen-impermeable material does not contain the inorganic plate-like compound, and in a case where the coating liquid L1 for forming a resin layer having the resin layer 18 formed contains the inorganic plate-like compound, a coating liquid containing a component obtained by removing the inorganic plate-like compound from the coating liquid L1 for forming a resin layer is used as the coating liquid L3 containing an oxygen-impermeable material.

In the phosphor-containing film according to the embodiment of the present invention, the method of forming the concave portion 18a of the resin layer 18 is not limited to the method shown in FIG. 11, and various known methods of forming a sheet-like material having concavity-convexity can be used.

For example, exemplified are a method in which the coating liquid L1 for forming a resin layer is first applied onto the first substrate film 12, the mold M is pressed against the coating liquid L1 for forming a resin layer, and then the coating liquid L1 for forming a resin layer is cured, and a method in which the first substrate film 12 and the mold M are laminated, the coating liquid L1 for forming a resin layer is filled between the first substrate film 12 and the mold M, and then the coating liquid L1 for forming a resin layer is cured.

Besides these methods, also available are a method in which a planar resin layer is formed and then the resin layer 18 having the concave portion 18a is formed by etching, and a method in which the resin layer 18 having the concave portion 18a is formed by using a printing method such as an inkjet method or a dispenser method.

Backlight Unit

Figure 14:
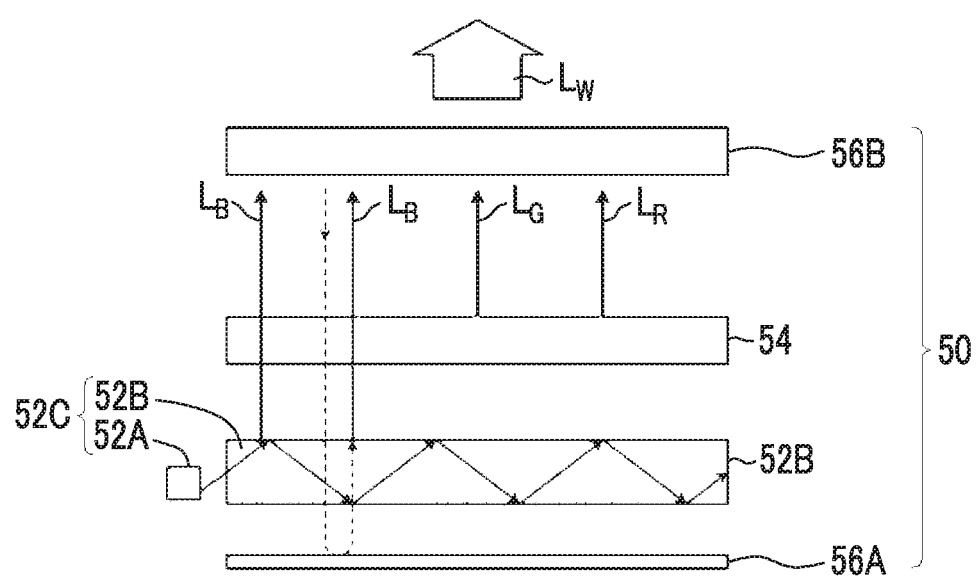
FIG. 14 is a diagram conceptually showing a configuration of an example of a backlight unit of the present invention.

With reference to the drawings, a description will be given of a backlight unit comprising a wavelength converting member as one embodiment of the phosphor-containing film according to the embodiment of the present invention. FIG. 14 is a schematic diagram showing a schematic configuration of a backlight unit.

As shown in FIG. 14, the backlight unit 50 comprises a planar light source 52C including a light source 52A that emits primary light (blue light $L_B$) and a light guide plate 52B that guides and emits primary light emitted from the light source 52A, a wavelength converting member 54 made of a phosphor-containing film according to the embodiment of the present invention provided on the planar light source 52C, a reflecting plate 56A arranged opposite to the wavelength converting member 54 with the planar light source 52C interposed therebetween, and a retroreflective member 56B. In FIG. 14, the reflecting plate 56A, the light guide plate 52B, the wavelength converting member 54, and the retroreflective member 56B are spaced apart from one another, but in reality these members may be formed in intimate attachment with one another.

The wavelength converting member 54 emits fluorescence by using at least a part of the primary light $L_B$ emitted from the planar light source 52C as excitation light and emits the secondary light (green light $L_G$ and red light $L_R$) composed of this fluorescence and the primary light $L_B$ transmitted through the wavelength converting member 54. For example, the wavelength converting member 54 is the phosphor-containing film 10 which is constituted such that the phosphor-containing layer 16 including the quantum dots that emit the green light $L_G$ and the quantum dots that emit the red light $L_R$ upon irradiation with the blue light $L_B$ is sandwiched between the first substrate film 12 and the second substrate film 14.

In FIG. 14, $L_B$, $L_G$, and $L_R$ emitted from the wavelength converting member 54 are incident on the retroreflective member 56B, and each incident light repeats reflection between the retroreflective member 56B and the reflecting plate 56A and passes through the wavelength converting member 54 many times. As a result, in the wavelength converting member 54, a sufficient amount of excitation light (blue light $L_B$) is absorbed by the phosphors 24 (in this case, quantum dots) in the phosphor-containing layer 16 and a necessary amount of fluorescence ($L_G$ and $L_R$) is emitted, and the white light $L_W$ is embodied from the retroreflective member 56B and is emitted.

From the viewpoint of realizing high luminance and high color reproducibility, it is preferable to use, as the backlight unit 50, one formed into a multi-wavelength light source. For example, preferred is a backlight unit which emits blue light having a luminescence center wavelength in the wavelength range of 430 to 480 nm and having a luminescence intensity peak with a half width of 100 nm or less, green light having a luminescence center wavelength in the wavelength range of 500 to 600 nm and having a luminescence intensity peak with a half-width of 100 nm or less, and red light having a luminescence center wavelength in the wavelength range of 600 to 680 nm and having a luminescence intensity peak with a half-width of 100 nm or less.

From the viewpoint of further improving luminance and color reproducibility, the wavelength range of the blue light emitted from the backlight unit 50 is more preferably 440 to 460 nm.

From the same viewpoint, the wavelength range of the green light emitted from the backlight unit 50 is preferably 520 to 560 nm and more preferably 520 to 545 nm.

In addition, from the same viewpoint, the wavelength range of the red light emitted from the backlight unit 50 is more preferably 610 to 640 nm.

In addition, from the same viewpoint, all the half-widths of the respective luminescence intensities of the blue light, the green light, and the red light emitted from the backlight unit 50 are preferably 80 nm or less, more preferably 50 nm or less, still more preferably 40 nm or less, and particularly preferably 30 nm or less. Among them, the half-width of the luminescence intensity of the blue light is particularly preferably 25 nm or less.

The light source 52A is, for example, a blue light emitting diode that emits blue light having a luminescence center wavelength in the wavelength range of 430 to 480 nm, but an ultraviolet light emitting diode that emits ultraviolet light may be used. As the light source 52A, a laser light source or the like may be used in addition to light emitting diodes. In a case where a light source that emits ultraviolet light is provided, the phosphor-containing layer 16 (wavelength converting layer) of the wavelength converting member 54 may include a phosphor that emits blue light, a phosphor that emits green light, and a phosphor that emits red light, upon irradiation with ultraviolet light.

As shown in FIG. 14, the planar light source 52C may be a planar light source formed of the light source 52A, and the light guide plate 52B which guides the primary light emitted from the light source 52A and allows the guided primary light to exit, or may be a planar light source in which the light source 52A and the wavelength converting member 54 are arranged parallel to each other on the plane, and a diffusion plate is provided in place of the light guide plate 52B. The former planar light source is generally referred to as an edge light mode backlight unit, and the latter planar light source is generally referred to as a direct backlight mode backlight unit.

In the present embodiment, a case where a planar light source is used as a light source has been described as an example, but a light source other than the planar light source may also be used as the light source.

Configuration of Backlight Unit

In FIG. 14, an edge light mode backlight unit including a light guide plate, a reflecting plate, and the like as constituent members has been illustrated as the configuration of the backlight unit, but the backlight unit may be a direct backlight mode backlight unit. A known light guide plate can be used without any limitation as the light guide plate.

In addition, the reflecting plate 56A is not particularly limited, and known reflecting plates can be used, which are described in JP3416302B, JP3363565B, JP4091978B, and JP3448626B, and the like, the contents of which are incorporated by reference herein in their entirety.

The retroreflective member 56B may be configured of a known diffusion plate or a known diffusion sheet, a known prism sheet (for example, BEF series manufactured by Sumitomo 3M Limited), a known light guide device, and the like. The configuration of the retroreflective member 56B is described in JP3416302B, JP3363565B, JP4091978B, JP3448626B, and the like, the contents of which are incorporated by reference herein in their entirety.

Liquid Crystal Display Device

Figure 15:
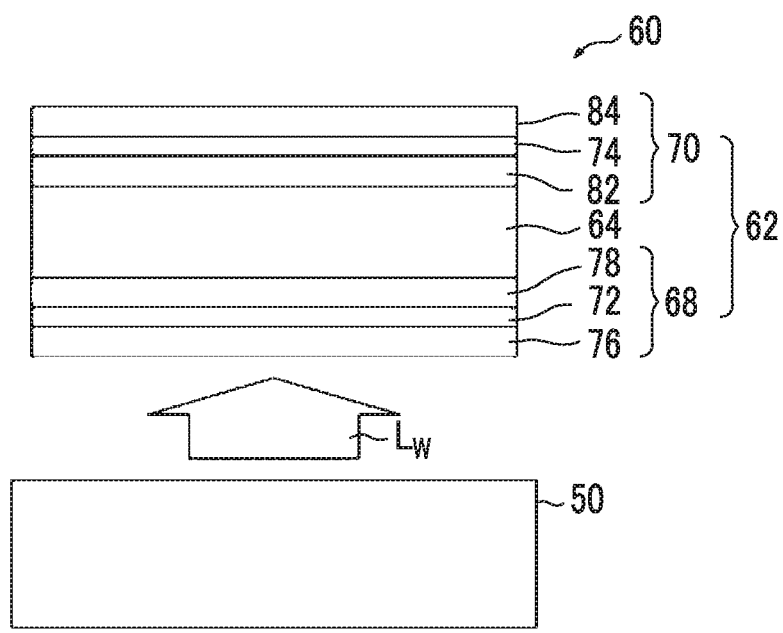
FIG. 15 is a diagram conceptually showing a configuration of an example of a liquid crystal display device using the backlight unit of the present invention.

The backlight unit 50 described above can be applied to a liquid crystal display device. FIG. 15 is a schematic diagram showing a schematic configuration of a liquid crystal display device.

As shown in FIG. 15, a liquid crystal display device 60 comprises the backlight unit 50 of the above-described embodiment, and a liquid crystal cell unit 62 arranged opposite to the retroreflective member side of the backlight unit.

As shown in FIG. 15, the liquid crystal cell unit 62 has a configuration in which a liquid crystal cell 64 is sandwiched between polarizing plates 68 and 70, and the polarizing plates 68 and 70 are configured such that both main surfaces of polarizers 72 and 74 are protected by polarizing plate protective films 76 and 78, and 82 and 84, respectively.

The liquid crystal cell 64 and the polarizing plates 68 and 70 constituting the liquid crystal display device 60 and the constituents thereof are not particularly limited, and members prepared by a known method and commercially available products can be used without any limitation. In addition, it is also possible, of course, to provide a known interlayer such as an adhesive layer between the respective layers.

A driving mode of the liquid crystal cell 64 is not particularly limited, and various modes such as a twisted nematic (TN) mode, a super twisted nematic (STN) mode, a vertical alignment (VA) mode, an in-plane switching (IPS) mode, and an optically compensated bend cell (OCB) mode can be used. The driving mode of the liquid crystal cell is preferably one of a VA mode, an OCB mode, an IPS mode, and a TN mode, but it is not limited thereto. An example of the configuration of the liquid crystal display device in the VA mode may be the configuration illustrated in FIG. 2 of JP2008-262161A. Here, a specific configuration of the liquid crystal display device is not particularly limited, and a known configuration can be adopted.

Further, the liquid crystal display device 60 includes a subsidiary functional layer such as an optical compensation member performing optical compensation or an adhesive layer, if necessary. In addition, a surface layer such as a forward scattering layer, a primer layer, an antistatic layer, or an undercoat layer may be arranged along with (or in place of) a color filter substrate, a thin layer transistor substrate, a lens film, a diffusion sheet, a hard coat layer, an antireflection layer, a low reflective layer, an antiglare layer, or the like.

The polarizing plate 68 on the backlight unit 50 side may include a phase difference film as a polarizing plate protective film 78 on the liquid crystal cell 64 side. A known cellulose acylate film or the like can be used as such a phase difference film.

The backlight unit 50 and the liquid crystal display device 60 are provided with the wavelength converting member made of the phosphor-containing film according to the embodiment of the present invention described above. Accordingly, a high-luminance backlight unit and a high-luminance liquid crystal display device, which exhibit the same effect as that of the above-mentioned phosphor-containing film according to the embodiment of the present invention and in which the luminescence intensity of the wavelength converting layer containing quantum dots is hardly lowered, are obtained.

EXAMPLES

Hereinafter, the present invention will be more specifically described with reference to Examples. The materials, use amounts, proportions, treatment contents, treatment procedures, and the like shown in the following Examples can be appropriately modified without departing from the spirit of the present invention. Therefore, the scope of the present invention should not be construed as being limited to the following specific Examples.

Example 1

Preparation of Phosphor-Containing Film

A phosphor-containing film having a phosphor-containing layer was prepared using a coating liquid containing quantum dots as a phosphor.

Preparation of Barrier Film

As a first substrate film and a second substrate film, a barrier film in which an inorganic layer and an organic layer were formed on a support film consisting of PET was produced as follows.

An organic layer and an inorganic layer were sequentially formed on one side of the support film according to the following procedure, using a PET film ("COSMOSHINE A4300", thickness: 23 μm, manufactured by Toyobo Co., Ltd.) as the support film.

Formation of Underlying Organic Layer

Trimethylolpropane triacrylate (TMPTA, manufactured by Daicel-Allnex Ltd.) and a photopolymerization initiator (ESACURE KTO46, manufactured by Lamberti S.p.A.) were prepared and weighed in a mass ratio of 95:5, and these were dissolved in methyl ethyl ketone to prepare a coating liquid having a solid content concentration of 15% for forming an underlying organic layer.

This coating liquid was applied on a support film (PET film) in a roll-to-roll process using a die coater and passed through a drying zone at 50° C. for 3 minutes. Thereafter, the coating liquid was cured by irradiation with ultraviolet rays under a nitrogen atmosphere (cumulative irradiation dose: about 600 mJ/cm$^2$), followed by winding up. The thickness of the organic layer formed on the support film was 1 μm.

Formation of Inorganic Layer

Next, a silicon nitride layer as the inorganic layer was formed on the surface of the underlying organic layer by using a CVD apparatus that carries out film formation by a roll-to-roll process.

Silane gas (flow rate: 160 sccm), ammonia gas (flow rate: 370 sccm), hydrogen gas (flow rate: 590 sccm), and nitrogen gas (flow rate: 240 sccm) were used as starting material gases. As a power source, a high-frequency power source with a frequency of 13.56 MHz was used. The film forming pressure was 40 Pa, and the film thickness reached was 50 nm.

Formation of Protective Organic Layer

Further, a protective organic layer was laminated on the surface of the inorganic layer. 5.0 parts by mass of a photopolymerization initiator (IRGACURE 184, manufactured by BASF Corporation) was weighed with respect to 95.0 parts by mass of a urethane skeleton acrylate polymer (ACRIT 8BR930, manufactured by Taisei Fine Chemical Co., Ltd.) and these materials were dissolved in methyl ethyl ketone to prepare a coating liquid having a solid content concentration of 15% for forming a protective organic layer.

This coating liquid was applied directly to the surface of the inorganic layer by a roll-to-roll process using a die coater and passed through a drying zone at 100° C. for 3 minutes. Thereafter, the coated film was cured by irradiation with ultraviolet rays (cumulative irradiation dose of about 600 mJ/cm$^2$) while being wound up and conveyed by a heat roll heated to 60° C. and then wound up. The thickness of the protective organic layer formed on the support film was 0.1 μm.

Thus, the barrier film with a protective organic layer was prepared as a first substrate film and a second substrate film.

In a case where the oxygen permeability of this barrier film was measured using OX-IRAN 2/20 (manufactured by MOCON Inc.) under conditions of a measurement temperature of 23° C. and a relative humidity of 90%, the oxygen permeability was $4.0 \times 10^{-3}$ cc/m$^2$·day·atm or less.

Formation of Resin Layer

Preparation of Coating Liquid for Forming Resin Layer

The following components were charged into a tank and mixed to prepare a coating liquid for forming a resin layer.

Coating Liquid for Forming Resin Layer

| | |
|---|---|
| Urethane (meth)acrylate (U-4 HA, manufactured by Shin-Nakamura Chemical Co., Ltd.) | 42 parts by mass |

-continued

| | |
|---|---|
| Tricyclodecane dimethanol diacrylate (A-DCP, manufactured by Shin-Nakamura Chemical Co., Ltd.) | 42 parts by mass |
| Flat alumina (inorganic layered compound: SERAPH 05070, manufactured by Kinsei Matec Co., Ltd.) | 15 parts by mass |
| Photopolymerization initiator (IRGACURE TPO, manufactured by BASF Corporation) | 1 part by mass |

Formation of Resin Layer

A mold having a convex portion corresponding to the concave portion of the resin layer and a concave portion corresponding to the wall portion was prepared as the mold for forming the resin layer.

Here, the concave portion of the resin layer (convex portion of the mold) was of a regular hexagonal shape having a side of 125 µm and was of a honeycomb pattern. The depth h of the concave portion (the height of the convex portion of the mold) was 40 µm, and the spacing between the concave portions (the spacing between the convex portions of the mold (the spacing t between the fluorescent materials, that is, the thickness of the wall portion)) was 50 µm (see FIG. 5). In addition, the concave portion of the mold M which is to be the wall portion had a corner portion at the bottom formed into a curved surface with a curvature radius of 10 µm.

The coating liquid for forming a resin layer prepared above was filled so as to completely fill the concave portion of such a mold. Next, the first substrate film (barrier film) was laminated on the mold so as to entirely cover the coating liquid for forming a resin layer, and the coating liquid for forming a resin layer was photocured in a state of being in pressure contact at a pressure of 0.5 MPa with a laminator.

The photocuring of the coating liquid for forming a resin layer was carried out by irradiation with ultraviolet rays at a dose of 500 mJ/cm$^2$ from the first substrate film side using an air-cooled metal halide lamp (manufactured by Eye Graphics Co., Ltd.) at 200 W/cm.

Subsequently, the mold was removed to prepare a laminate in which the resin layer was laminated on the first substrate film (see FIG. 11).

In addition, using the coating liquid for forming a resin layer, a film having a thickness of 50 µm was formed under the completely same conditions. That is, this film corresponds to a wall portion of 50 µm in thickness in the resin layer. In a case where the oxygen permeability of this film was measured in the same manner as above, the oxygen permeability was 8 cc/m$^2$·day·atm.

In addition, in a case where the modulus of elasticity of the resin layer after curing was measured according to JIS K7161, the modulus of elasticity was 4.2 GPa.

Preparation of Phosphor-Containing Film

Preparation of Coating Liquid for Forming Fluorescent Material

The following components were charged into a tank and mixed to prepare a coating liquid for forming a fluorescent material.

Coating Liquid for Forming Fluorescent Material

| | |
|---|---|
| Toluene dispersion liquid of quantum dots 1 (emission maximum: 520 nm) | 20% by mass |
| Toluene dispersion liquid of quantum dots 2 (emission maximum: 630 nm) | 2% by mass |
| Dicyclopentanylacrylate (DCP, manufactured by Hitachi Chemical Co., Ltd., FA-513AS) | 78.8% by mass |
| Tricyclodecanedimethanoldiacrylate (A-DCP, manufactured by Shin-Nakamura Chemical Co., Ltd.) | 20% by mass |
| Light scattering particles (TOSPEARL 120, manufactured by Momentive Performance Materials Inc.) | 20% by mass |
| Photopolymerization initiator (IRGACURE TPO, manufactured by BASF Corporation) | 0.2% by mass |

The following nanocrystals having a core-shell structure (InP/ZnS) were used as quantum dots 1 and 2.

Quantum dots 1: INP 530-10 (manufactured by NN-Labs, LLC)

Quantum dots 2: INP 620-10 (manufactured by NN-Labs, LLC)

Formation of Phosphor-Containing Layer (Fluorescent Material) and Preparation of Phosphor-Containing Film First, the concave portion of the resin layer was filled with the prepared coating liquid for forming a fluorescent material so that the concave portion of the resin layer of the prepared laminate of the first substrate film and the resin layer was completely filled. Next, the second substrate film (barrier film) was laminated on the resin layer so as to entirely cover the coating liquid for forming a fluorescent material, and the coating liquid for forming a fluorescent material was photocured in a state of being in pressure contact at a pressure of 0.3 MPa with a laminator to form a fluorescent material-containing layer in which the fluorescent material was formed in concave portions discretely formed in the resin layer. In this manner, a phosphor-containing film was prepared (see FIG. 12).

The photocuring of the coating liquid for forming a fluorescent material was carried out by irradiation with ultraviolet rays at a dose of 500 mJ/cm$^2$ from the first substrate film side using an air-cooled metal halide lamp (manufactured by Eye Graphics Co., Ltd.) at 200 W/cm.

The prepared phosphor-containing film was cut with a microtome, and the cross section of the section was observed by SEM. As a result, this phosphor-containing film had a gap of 0.5 µm between the upper end of the wall portion of the resin layer and the second substrate film.

The distribution of luminescent particles in the above cross section was observed with a confocal laser microscope (TCS SP5, manufactured by Leica Camera AG) using a 405 nm excitation, 50× objective lens. As a result, it was confirmed in the phosphor-containing film that a 0.5 µm-thick layer containing phosphor particles (a layer made of a fluorescent material (a fluorescent material layer)), which was similar to the fluorescent material formed in the concave portion of the resin layer, was formed between the upper end of the wall portion of the resin layer and the second substrate film.

Examples 2 to 4 and Comparative Example 1

Phosphor-containing films were prepared in the same manner as in Example 1, except that the gap between the upper end of the wall portion of the resin layer and the second substrate film was changed to 0 μm (Comparative Example 1), 1 μm (Example 2), 3 μm (Example 3), and 6 μm (Example 4) by changing the pressure of the laminator to 0.5 MPa (Comparative Example 1), 0.2 MPa (Example 2), 0.1 MPa (Example 3), and 0.05 MPa (Example 4) in the formation of the phosphor-containing layer, and the same confirmation was carried out.

Example 5

Preparation of Coating Liquid Containing Oxygen-Impermeable Material

The following components were charged into a tank and mixed to prepare a coating liquid containing an oxygen-impermeable material.

Coating Liquid Containing Oxygen-Impermeable Material

| | |
|---|---|
| Urethane (meth)acrylate (U-4 HA, manufactured by Shin-Nakamura Chemical Co., Ltd.) | 49.5 parts by mass |
| Tricyclodecane dimethanol diacrylate (A-DCP, manufactured by Shin-Nakamura Chemical Co., Ltd.) | 49.5 parts by mass |
| Photopolymerization initiator (IRGACURE TPO, manufactured by BASF Corporation) | 1 part by mass |

Before laminating the second substrate film on the resin layer, this coating liquid containing an oxygen-impermeable material was applied to the second substrate film by a roll-to-roll process using a die coater (see FIG. 13). The film thickness of the coating liquid was 3 μm.

A phosphor-containing film was prepared in the same manner as in Example 1, except that the second substrate film coated with this coating liquid containing an oxygen-impermeable material was laminated on the resin layer with the coating liquid side as the resin layer side.

In a case of being observed in the same manner as in Example 1, this phosphor-containing film had a gap of 3 μm between the upper end of the wall portion of the resin layer and the second substrate film.

In addition, in a case of being observed in the same manner as in Example 1, it was confirmed in this phosphor-containing film that a 3 μm-thick layer containing phosphor particles was formed between the upper end of the wall portion of the resin layer and the second substrate film. However, the amount of phosphor particles in this layer was lower than the amount of phosphor particles in the concave portion of the resin layer. That is, this phosphor-containing film had a 3 μm-thick mixed layer between the upper end of the wall portion of the resin layer and the second substrate film.

In addition, a film having a thickness of 50 μm was formed under the curing conditions similar to the curing conditions of the coating liquid for forming a fluorescent material using the coating liquid containing an oxygen-impermeable material.

In a case where the oxygen permeability of this film was measured in the same manner as above, the oxygen permeability was 20 cc/m²·day·atm.

Example 6

A phosphor-containing film was prepared in the same manner as in Example 5, except that the film thickness of the coating liquid containing an oxygen-impermeable material to be applied to the second substrate film was changed to 5 μm.

In a case of being observed in the same manner as in Example 1, this phosphor-containing film had a gap of 4 μm between the upper end of the wall portion of the resin layer and the second substrate film.

In addition, in a case of being observed in the same manner as in Example 1, it was confirmed in this phosphor-containing film that a 3 μm-thick layer containing phosphor particles on the resin layer side and a 1 μm-thick layer not containing phosphor particles on the second substrate film side were formed between the upper end of the wall portion of the resin layer and the second substrate film. The amount of phosphor particles in the layer containing phosphor particles was lower than the amount of phosphor particles in the concave portion of the resin layer. That is, this phosphor-containing film had a 3 μm-thick mixed layer and a 1 μm-thick impermeable layer between the upper end of the wall portion of the resin layer and the second substrate film.

Example 7

A phosphor-containing film was prepared in the same manner as in Example 5, except that the film thickness of the coating liquid containing an oxygen-impermeable material to be applied to the second substrate film was changed to 9 μm.

In a case of being observed in the same manner as in Example 1, this phosphor-containing film had a gap of 6 μm between the upper end of the wall portion of the resin layer and the second substrate film.

In addition, in a case of being observed in the same manner as in Example 1, it was confirmed in this phosphor-containing film that a 3 μm-thick layer containing phosphor particles on the resin layer side and a 3 μm-thick layer not containing phosphor particles on the second substrate film side were formed between the upper end of the wall portion of the resin layer and the second substrate film. The amount of phosphor particles in the layer containing phosphor particles was lower than the amount of phosphor particles in the concave portion of the resin layer. That is, this phosphor-containing film had a 3 μm-thick mixed layer and a 3 μm-thick impermeable layer between the upper end of the wall portion of the resin layer and the second substrate film. In the present example, the mixed layer was also present in the concave portion of the resin layer.

Example 8

A phosphor-containing film was prepared in the same manner as in Example 5, except that the film thickness of the coating liquid containing an oxygen-impermeable material to be applied to the second substrate film was changed to 20 μm.

In a case of being observed in the same manner as in Example 1, this phosphor-containing film had a gap of 16 μm between the upper end of the wall portion of the resin layer and the second substrate film.

In addition, in a case of being observed in the same manner as in Example 1, it was confirmed in this phosphor-containing film that a 3 μm-thick layer containing phosphor particles on the resin layer side and a 13 μm-thick layer not containing phosphor particles on the second substrate film side were formed between the upper end of the wall portion of the resin layer and the second substrate film. The amount of phosphor particles in the layer containing phosphor particles was lower than the amount of phosphor particles in the concave portion of the resin layer. That is, this phosphor-containing film had a 3 μm-thick mixed layer and a 13 μm-thick impermeable layer between the upper end of the wall portion of the resin layer and the second substrate film. In the present example, the mixed layer was also present in the concave portion of the resin layer.

Evaluation

The phosphor-containing films prepared in Examples and Comparative Examples were wavelength converting members, and the luminescence performance of these wavelength converting members was measured and evaluated as follows.

Incidentally, each wavelength converting member (phosphor-containing film) was cut into a predetermined size using a Thomson blade MIR-CI23 manufactured by Nakayama Corporation and used for each evaluation. Each side of the cut wavelength converting member straddles the resin layer and the fluorescent material.

Evaluation of Adhesion (Peel Force)

The prepared wavelength converting member was cut into a strip of 150 mm long and 25 mm wide. The peel force F (N/25 mm) between the second substrate film and the phosphor-containing layer was measured under the conditions of a peeling angle of 180° and a peeling speed of 300 mm/min according to JIS K6854 (T-type peeling) and evaluated based on the following standards. In addition, in order to obtain a clear adhesion boundary, the measurement was carried out using a sample in which an anti-adhesive tape was attached to the second substrate film, with the non-adhesive portion as a grip.

Evaluation Standards

A: F≥30
B: 30>F≥20
C: 20>F≥10
D: 10>F

Initial Luminance

A backlight unit was taken out by disassembling a commercially available tablet terminal equipped with a blue light source in the backlight unit (Kindle Fire HDX 7, manufactured by Amazon). Instead of Quantum Dot Enhancement Film (QDEF), the wavelength conversion film was incorporated into the backlight unit, each of a wavelength converting members of Examples or Comparative Examples cut into a rectangle was incorporated. In this manner, a liquid crystal display device was prepared.

The prepared liquid crystal display device was turned on so that the whole surface became white display and the luminance was measured with a luminance meter (SR3, manufactured by Topcon Corporation) installed at a position 520 mm in the direction perpendicular to the surface of the light guide plate.

The initial luminance $Y_0$ (cd/m$^2$) was evaluated based on the following evaluation standards.

Evaluation Standards

A: $Y_0$≥530
B: 530>$Y_0$≥515
C: 515>$Y_0$≥500
D: 500>$Y_0$

Evaluation of Edge Luminance Deterioration

In a room kept at 85° C., each wavelength converting member was placed on a commercially available blue light source (OPSM-H150X142B, manufactured by OPTEX-FA Co., Ltd.) and the wavelength converting member was continuously irradiated with blue light for 1000 hours. After irradiation with blue light for 1000 hours, the wavelength converting member was observed with an optical microscope to evaluate a distance Lmm of edge luminance deterioration (the distance at which the chromaticity change or the luminance decrease can be confirmed).

Evaluation Standards

A: L≤0.3
B: 0.3<L≤0.5
C: 0.5<L≤1.0
D: 1.0<L

The results are shown in the following table.

TABLE 1

|  | Impermeable material | Between upper end of wall portion and second substrate film | | | | Evaluation | | |
| --- | --- | --- | --- | --- | --- | --- | --- | --- |
|  | Coating thickness [μm] | Gap [μm] | Flourescent material layer [μm] | Mixed layer [μm] | Impermeable layer [μm] | Adhesion | Initial luminance | edge luminance deterioration |
| Comparative Example 1 | None | 0 | 0 | None | None | D | A | C |
| Example 1 | None | 0.5 | 0.5 | None | None | B | A | B |
| Example 2 | None | 1 | 1 | None | None | B | A | B |
| Example 3 | None | 3 | 3 | None | None | A | A | B |
| Example 4 | None | 6 | 6 | None | None | A | A | C |
| Example 5 | 3 | 3 | None | 3 | None | A | A | A |
| Example 6 | 5 | 4 | None | 3 | 1 | A | B | A |
| Example 7 | 9 | 6 | None | 3 | 3 | A | B | A |
| Example 8 | 20 | 16 | None | 3 | 13 | A | C | A |

As shown in Table 1, the phosphor-containing film (wavelength converting member) according to the embodiment of the present invention exhibits excellent adhesion between the phosphor-containing layer and the second substrate film.

In particular, the adhesion between the phosphor-containing layer and the second substrate film is very excellent in Examples 3 to 8 in which the gap between the upper end of the resin layer and the second substrate film is 3 μm or more.

In addition, high initial luminance is obtained in Examples 1 to 4 in which the space between the upper end of the resin layer and the second substrate film is of a fluorescent material.

In addition, the effects of suppressing the luminance deterioration at the edge are also excellent in addition to satisfactory adhesion in Examples 5 to 8 having a mixed layer or further an impermeable layer, since oxygen permeating through the gap between the upper end of the resin layer and the second substrate film can be reduced.

On the other hand, the phosphor-containing film of Comparative Example 1 having no gap between the upper end of the resin layer and the second substrate film is significantly inferior in the adhesion between the phosphor-containing layer and the second substrate film, as compared to the phosphor-containing film according to the embodiment of the present invention. In addition, in Comparative Example 1, it is considered that oxygen penetrated from between the upper end of the resin layer and the second substrate film since the upper end of the resin layer is not in intimate attachment with the second substrate film, so it is considered that the luminance deterioration at the edge has become a grade of "C" even though there is no gap between the upper end of the resin layer and the second substrate film.

From the above results, the effects of the present invention are clear.

The phosphor-containing film according to the embodiment of the present invention can be suitably used for liquid crystal displays and the like.

EXPLANATION OF REFERENCES 10, 10A, 10B: phosphor-containing film
12: first substrate film
12a, 14a: support film
12b, 14b: barrier layer
14: second substrate film
16: phosphor-containing layer
18: resin layer
18a: concave portion
20: fluorescent material
24, 24e: phosphor
26: binder
28: mixed layer
30: impermeable layer
34: underlying organic layer
36: inorganic layer
38: protective organic layer
50: backlight unit
52A: light source
52B: light guide plate
52C: planar light source
54: wavelength converting member
56A: reflecting plate
56B: retroreflective member
60: liquid crystal display device
62: liquid crystal cell unit
64: liquid crystal cell
68, 70: polarizing plate
72, 74: polarizer
76, 78, 82, 84: polarizing plate protective film L1: coating liquid for forming resin layer
L2: coating liquid for forming fluorescent material
L3: coating liquid containing oxygen-impermeable material
M: mold

What is claimed is:

1. A phosphor-containing film comprising:
   a phosphor-containing layer having a resin layer in which a plurality of discretely arranged concave portions are formed, and a fluorescent material filled in the concave portions formed in the resin layer; and
   a first substrate film laminated on a main surface on a bottom side of the concave portions of the resin layer, and a second substrate film laminated on the other main surface of the resin layer,
   wherein the fluorescent material contains a phosphor and a binder,
   the concave portions of the resin layer do not pass completely through the resin layer,
   the fluorescent material filled in the concave portions of the resin layer and the first substrate film are not in contact with each other,
   at least a part of a wall portion forming the concave portions of the resin layer has a second substrate film-side end spaced apart from the second substrate film,
   the fluorescent material is also present between the second substrate film and the second substrate film-side end of the wall portion spaced apart from the second substrate film, and
   the wall portion is a region of the resin layer between the fluorescent material and the fluorescent material in a surface direction of the phosphor-containing layer and a region of the resin layer outside the outermost fluorescent material in the surface direction, and
   at least one of the fluorescent material or the resin layer contains a light scattering particle.

2. The phosphor-containing film according to claim 1, wherein a distance between the second substrate film and the second substrate film-side end of the wall portion spaced apart from the second substrate film is 0.01 to 10 μm.

3. The phosphor-containing film according to claim 1, wherein the resin layer has impermeability to oxygen.

4. The phosphor-containing film according to claim 1, wherein all of ends on the second substrate film side of the wall portion of the resin layer are spaced apart from the second substrate film.

5. The phosphor-containing film according to claim 1, wherein the fluorescent material present between the second substrate film and the second substrate film-side end of the wall portion spaced apart from the second substrate film contains a material having impermeability to oxygen, in addition to the phosphor and the binder.

6. The phosphor-containing film according to claim 5, further comprising: between the second substrate film and the second substrate film-side end of the wall portion spaced apart from the second substrate film,
   a layer including the fluorescent material containing the material having impermeability to oxygen, in addition to the phosphor and the binder; and
   a layer including the material having impermeability to oxygen and located closer to the second substrate film than the layer including the fluorescent material.

7. The phosphor-containing film according to claim 5, wherein the material having impermeability to oxygen has the same components as a material for forming the resin layer and does not contain an inorganic layered compound.

8. A backlight unit comprising:
a wavelength converting member made of the phosphor-containing film according to claim 1; and
at least one of a blue light emitting diode or an ultraviolet light emitting diode.

\* \* \* \* \*